(12) United States Patent
Amimoto et al.

(10) Patent No.: US 10,848,271 B2
(45) Date of Patent: Nov. 24, 2020

(54) COMMUNICATION UNIT AND COMMUNICATION SYSTEM

(71) Applicant: Sony Semiconductor Solutions Corporation, Kanagawa (JP)

(72) Inventors: Tatsuki Amimoto, Tokyo (JP); Ryoji Ikegaya, Tokyo (JP); Kentaro Nakahara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/310,571

(22) PCT Filed: Jul. 6, 2017

(86) PCT No.: PCT/JP2017/024831
§ 371 (c)(1),
(2) Date: Dec. 17, 2018

(87) PCT Pub. No.: WO2018/025570
PCT Pub. Date: Feb. 8, 2018

(65) Prior Publication Data
US 2019/0181978 A1 Jun. 13, 2019

(30) Foreign Application Priority Data
Aug. 1, 2016 (JP) ................. 2016-151259

(51) Int. Cl.
*H04L 1/00* (2006.01)

(52) U.S. Cl.
CPC .............. *H04L 1/0056* (2013.01); *H04L 1/00* (2013.01); *H04L 1/0045* (2013.01)

(58) Field of Classification Search
CPC ........ H04L 1/0056; H04L 1/00; H04L 1/0045
See application file for complete search history.

(56) References Cited

U.S. PATENT DOCUMENTS 7,823,046 B2 * 10/2010 Hirabayashi ........ G06F 11/1008
714/704
8,001,292 B2 * 8/2011 Ohyama ............... G06F 1/3215
710/15

(Continued)

FOREIGN PATENT DOCUMENTS

JP      04-262630     9/1992
JP      09-064851     3/1997

(Continued)

OTHER PUBLICATIONS

Jose, R., et al. "Analysis of hard decision and soft decision decoding algorithms of LDPC codes in AWGN", 2015 IEEE International Advance Computing Conference (IACC), IEEE, Conference Location: Banglore, India, pp. 430-435. (Year: 2015).*

*Primary Examiner* — Kyle Vallecillo
(74) *Attorney, Agent, or Firm* — Michael Best & Friedrich LLP

(57) ABSTRACT

A communication unit of the present disclosure includes a decoding section configured to decode transfer data transmitted from a communicated unit, by a first method using a first error detecting code, and a second method using at least an error correcting code, and a determination section that performs determination as to whether the transfer data are data in the first method including the first error detecting code or data in the second method including the error correcting code.

18 Claims, 22 Drawing Sheets

(56) References Cited

U.S. PATENT DOCUMENTS

| | | | | |
|---|---|---|---|---|
| 2004/0193966 | A1* | 9/2004 | Hirabayashi | G06F 11/1008 714/54 |
| 2008/0163033 | A1* | 7/2008 | Yim | G06F 11/1008 714/785 |
| 2010/0241927 | A1* | 9/2010 | Soma | G06F 11/1052 714/760 |
| 2011/0154159 | A1* | 6/2011 | Tanaka | H03M 13/091 714/758 |
| 2017/0285942 | A1* | 10/2017 | Yang | G06F 11/1076 |
| 2018/0024879 | A1* | 1/2018 | Kim | H03M 13/3723 714/764 |

FOREIGN PATENT DOCUMENTS

| | | |
|---|---|---|
| JP | 2001-007785 A | 1/2001 |
| JP | 2005-311608 A | 11/2005 |
| JP | 2008-198137 A | 8/2008 |
| JP | 2009-021941 A | 1/2009 |
| WO | WO-2004/010618 A1 | 1/2004 |

\* cited by examiner

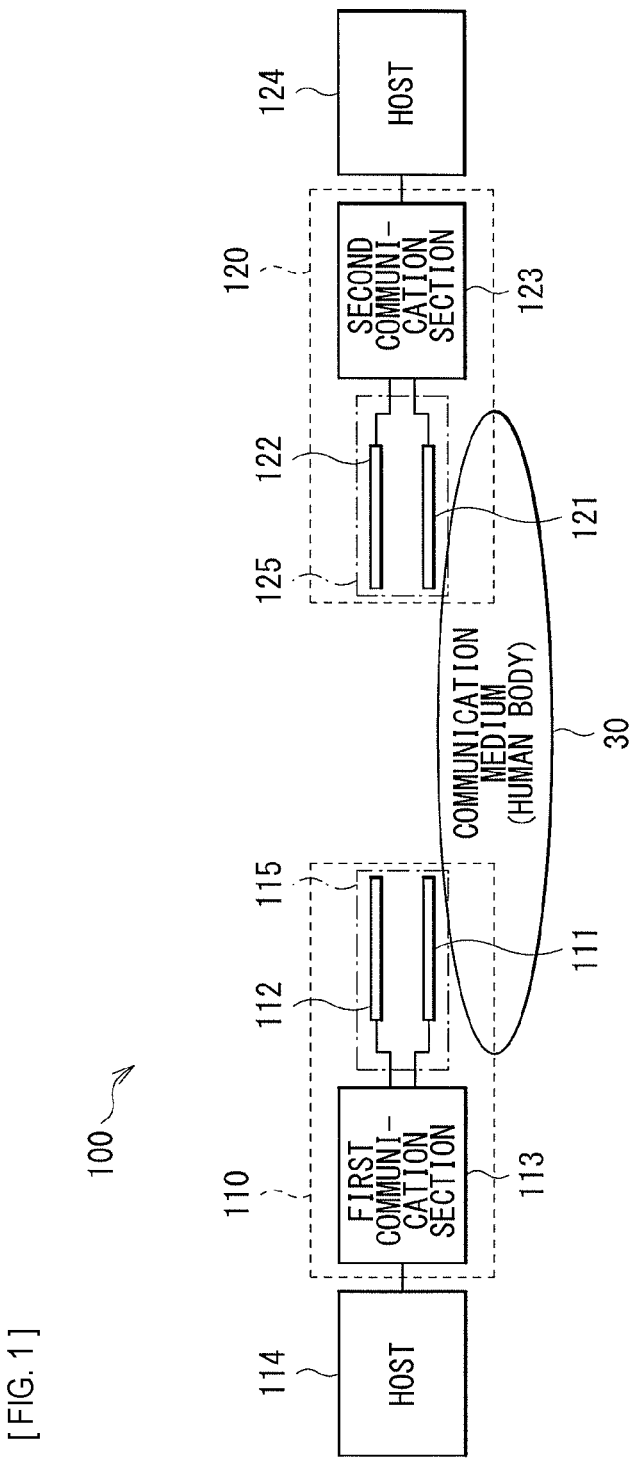
[FIG. 1]

[ FIG. 2 ]
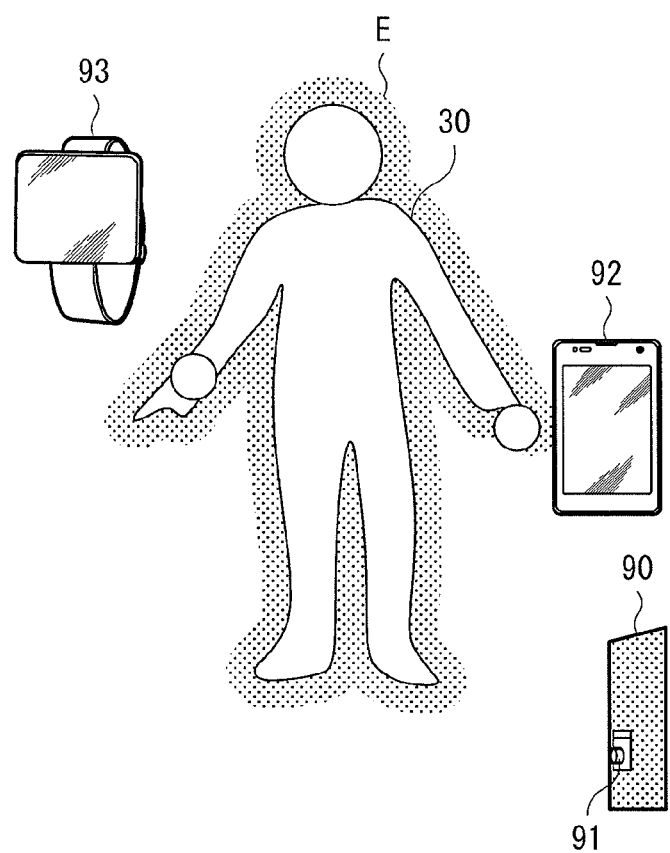

[ FIG. 3 ]
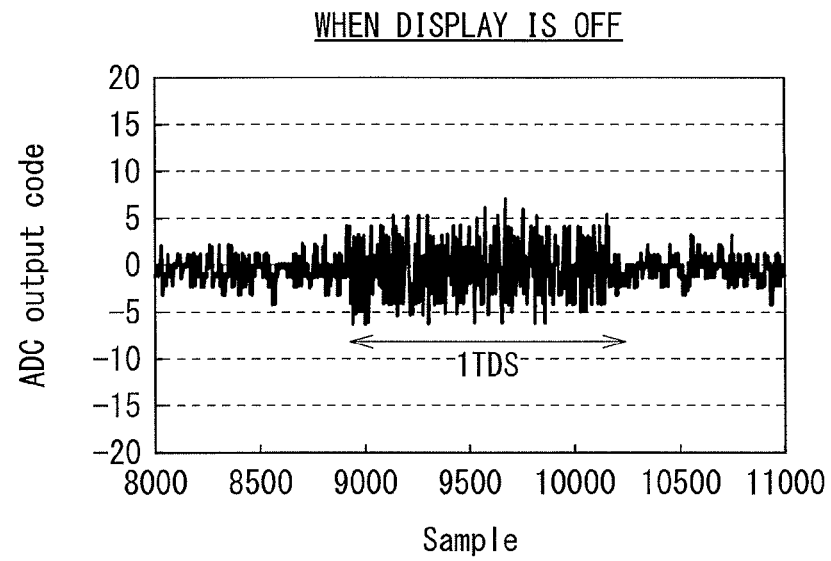
[ FIG. 4 ]
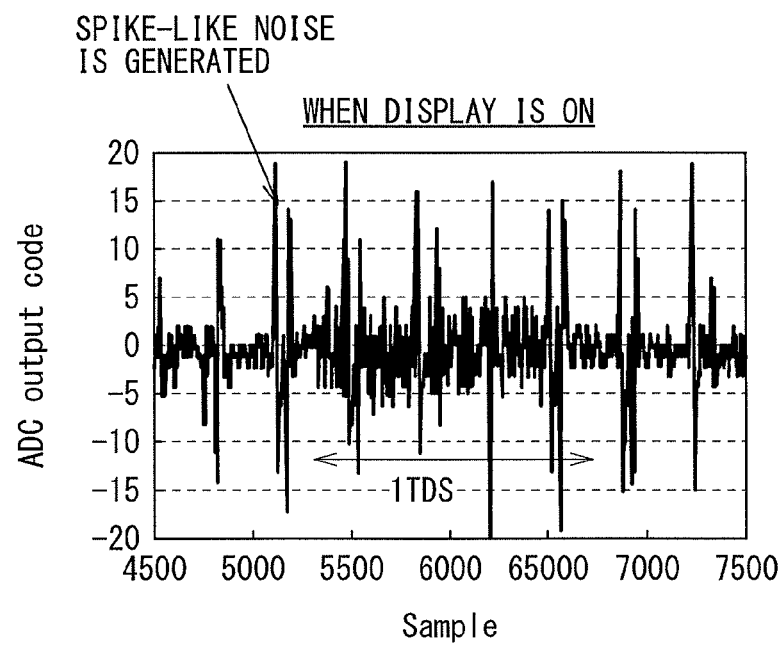

[ FIG. 5 ]
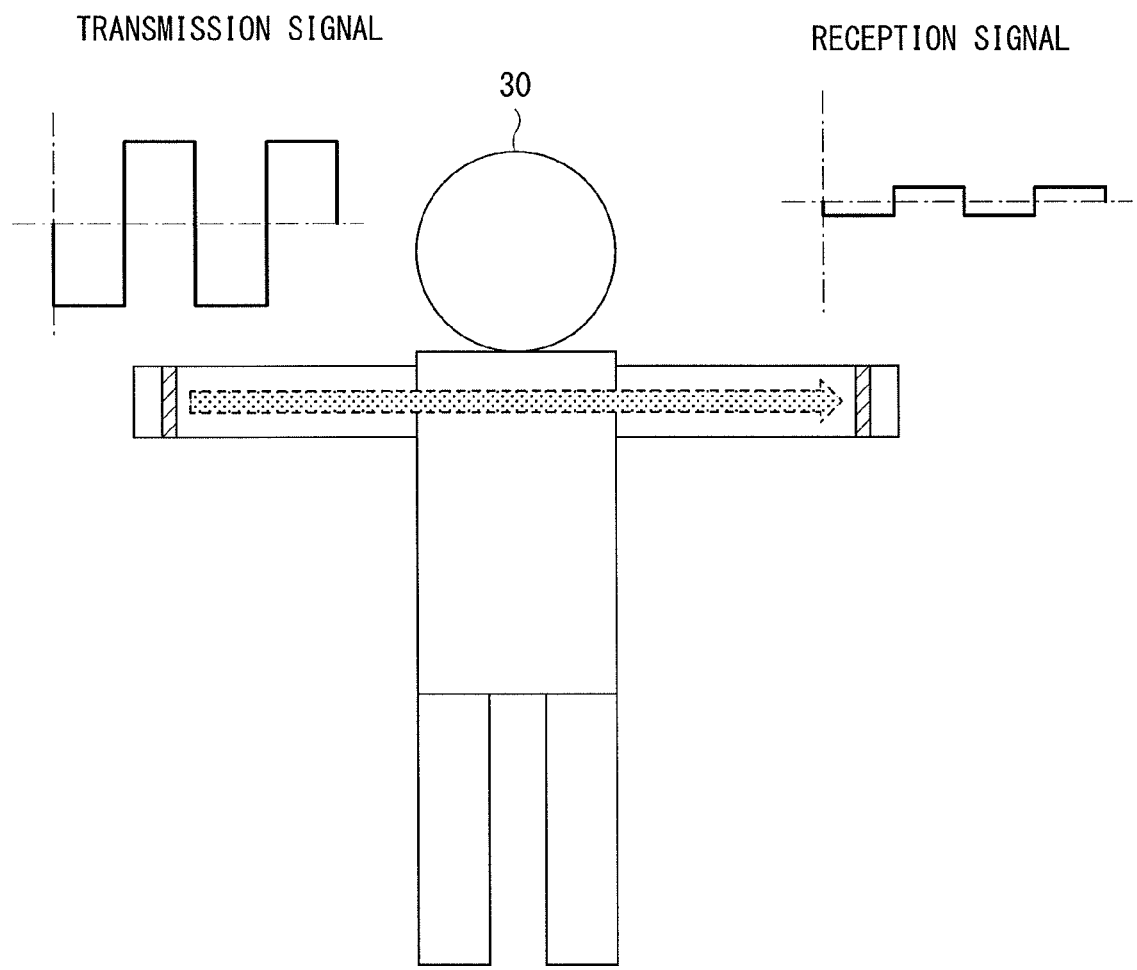

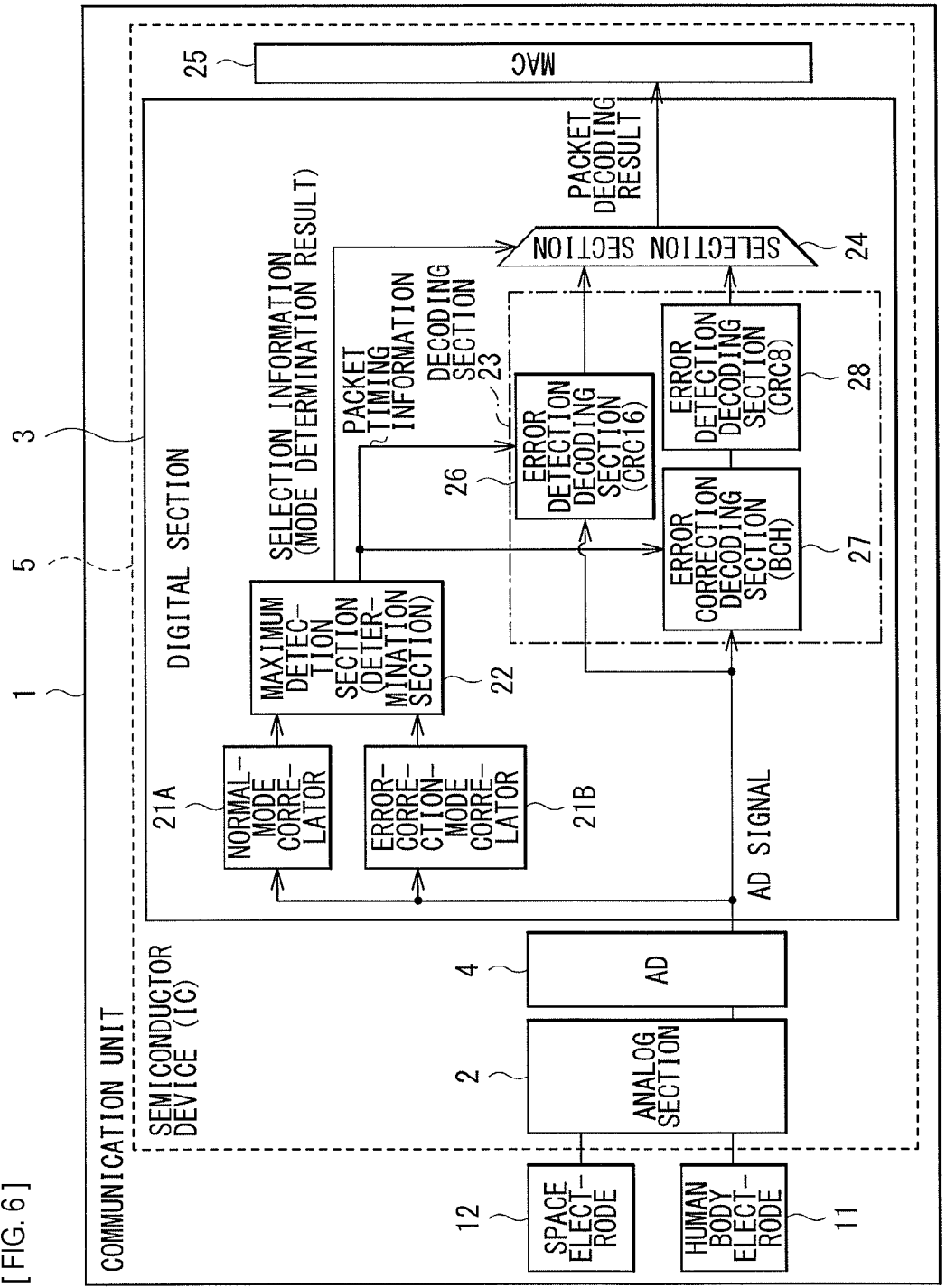
[FIG. 6]

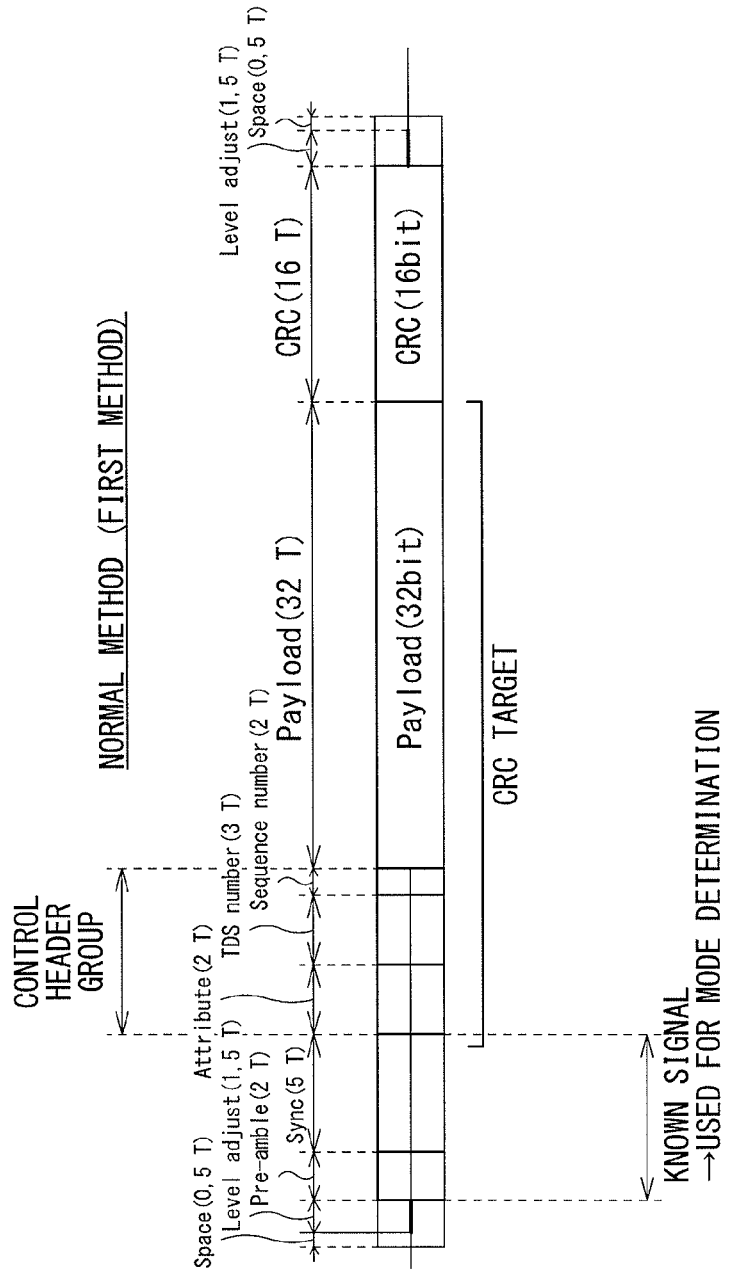
[FIG. 7]

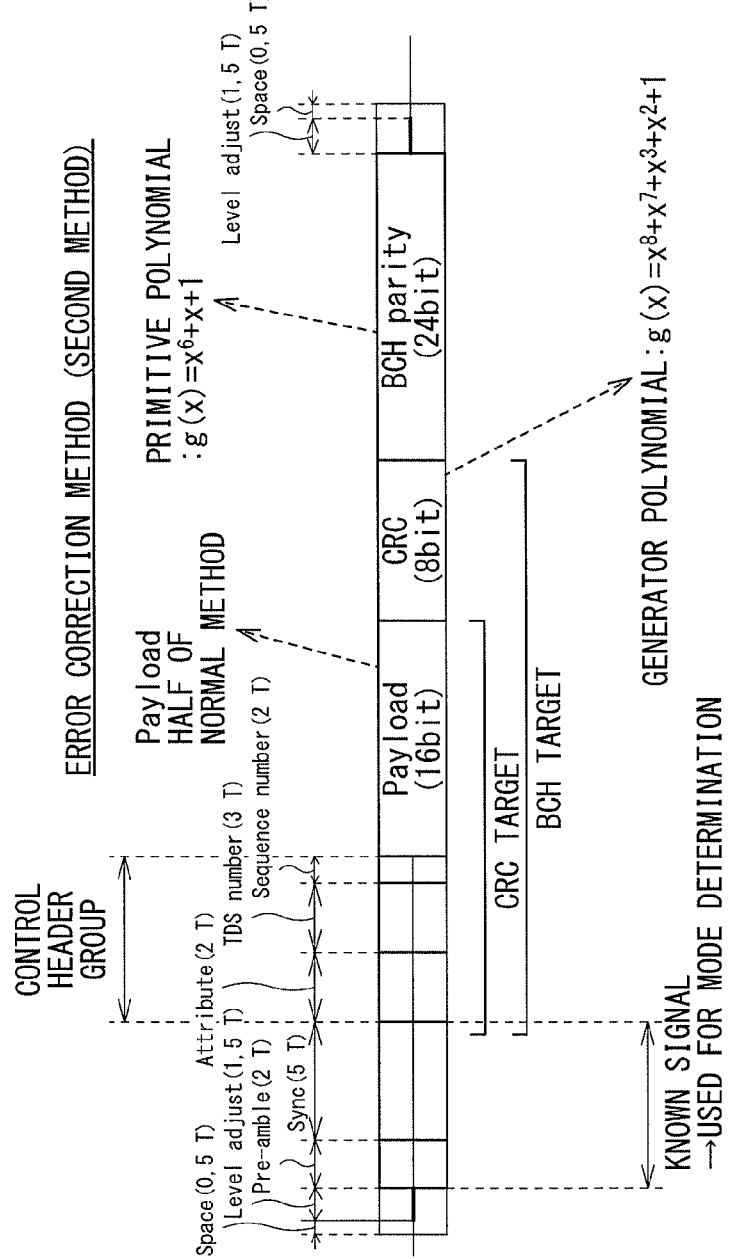
[FIG. 8]

[ FIG. 9 ]
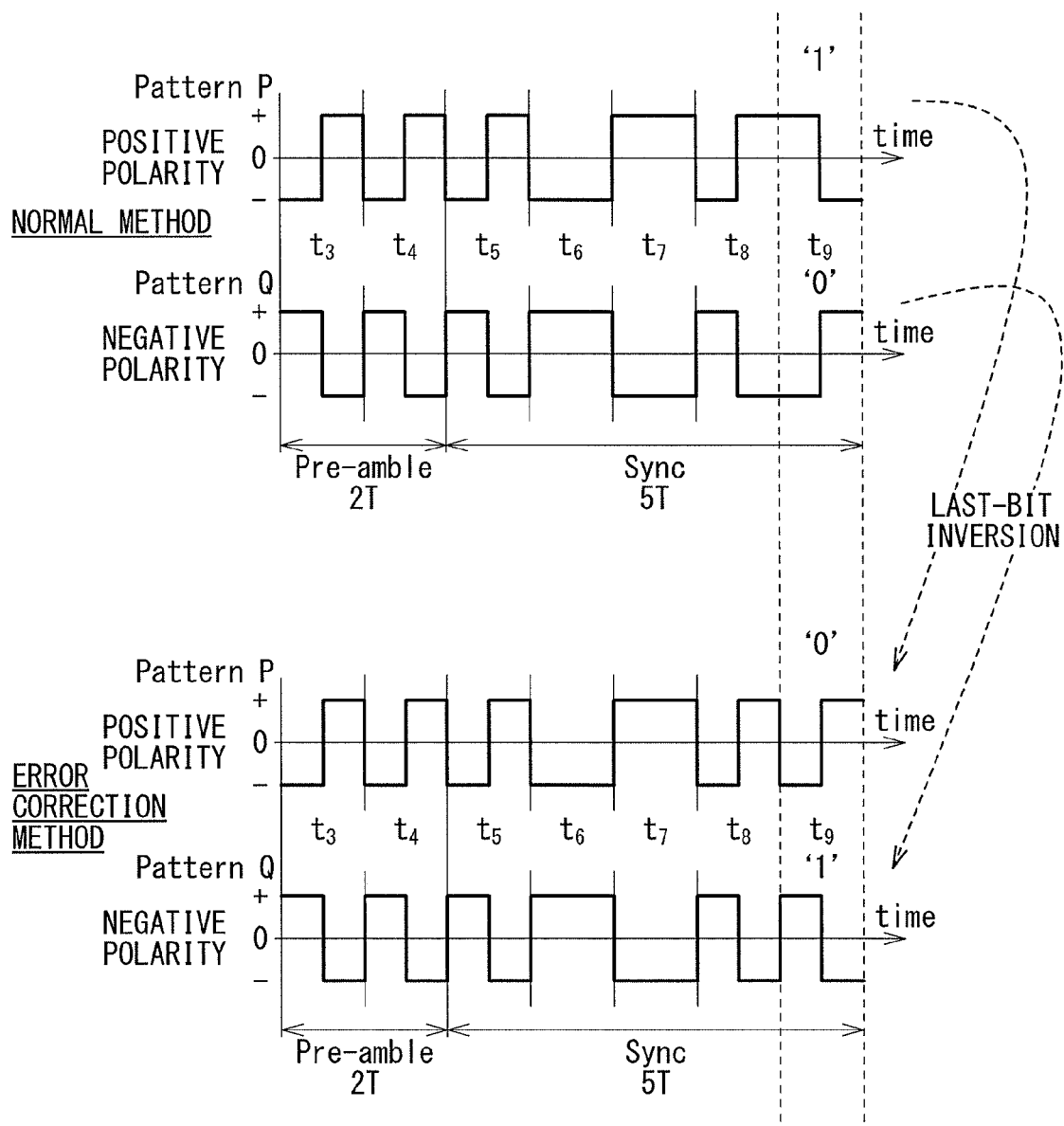

[ FIG. 10 ]
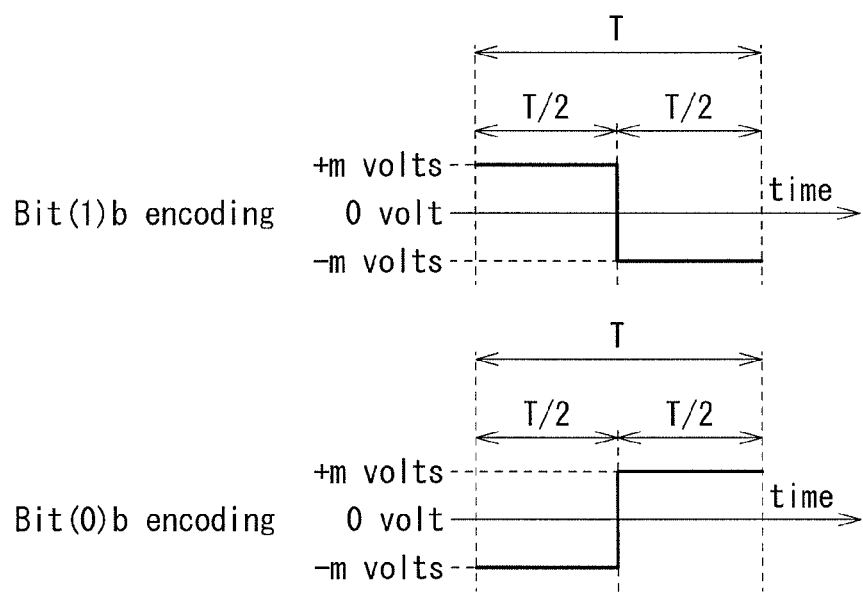

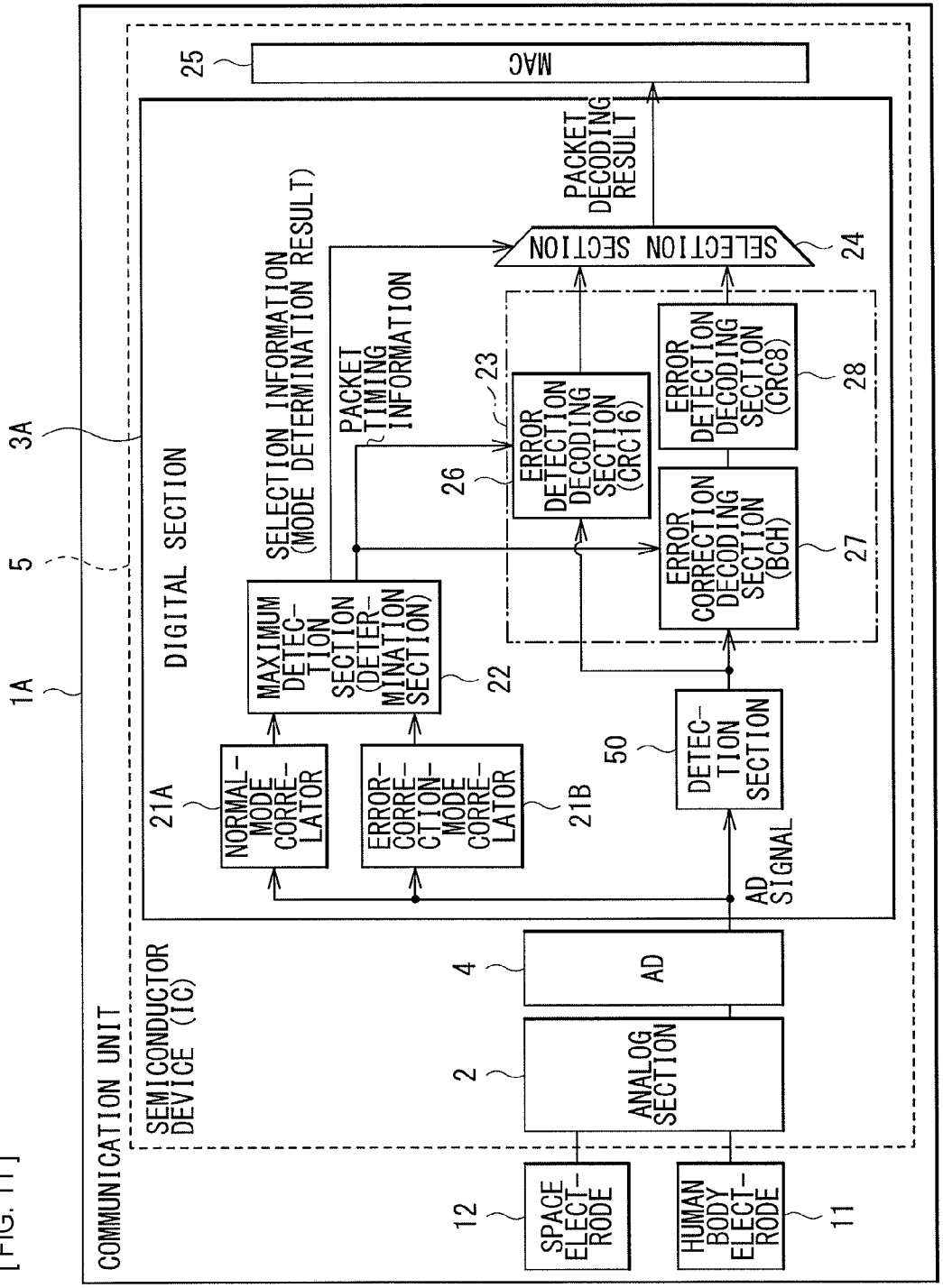
[FIG. 11]

[ FIG. 12 ]
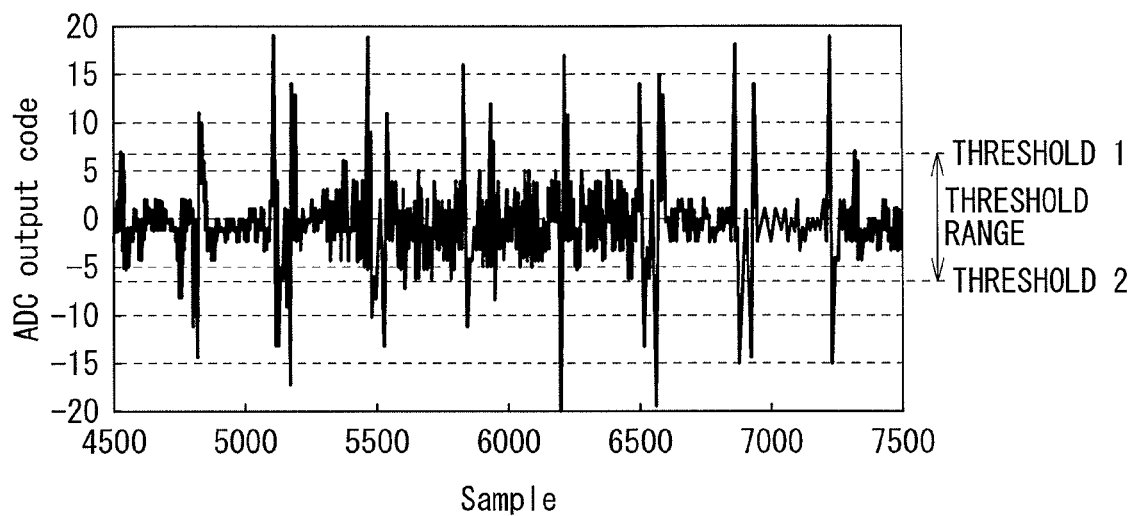
[ FIG. 13 ]
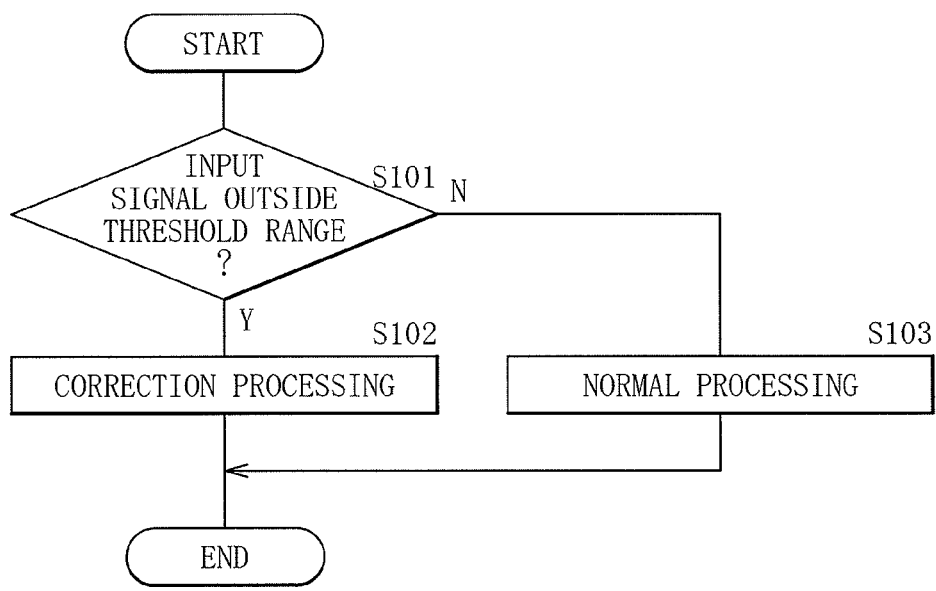

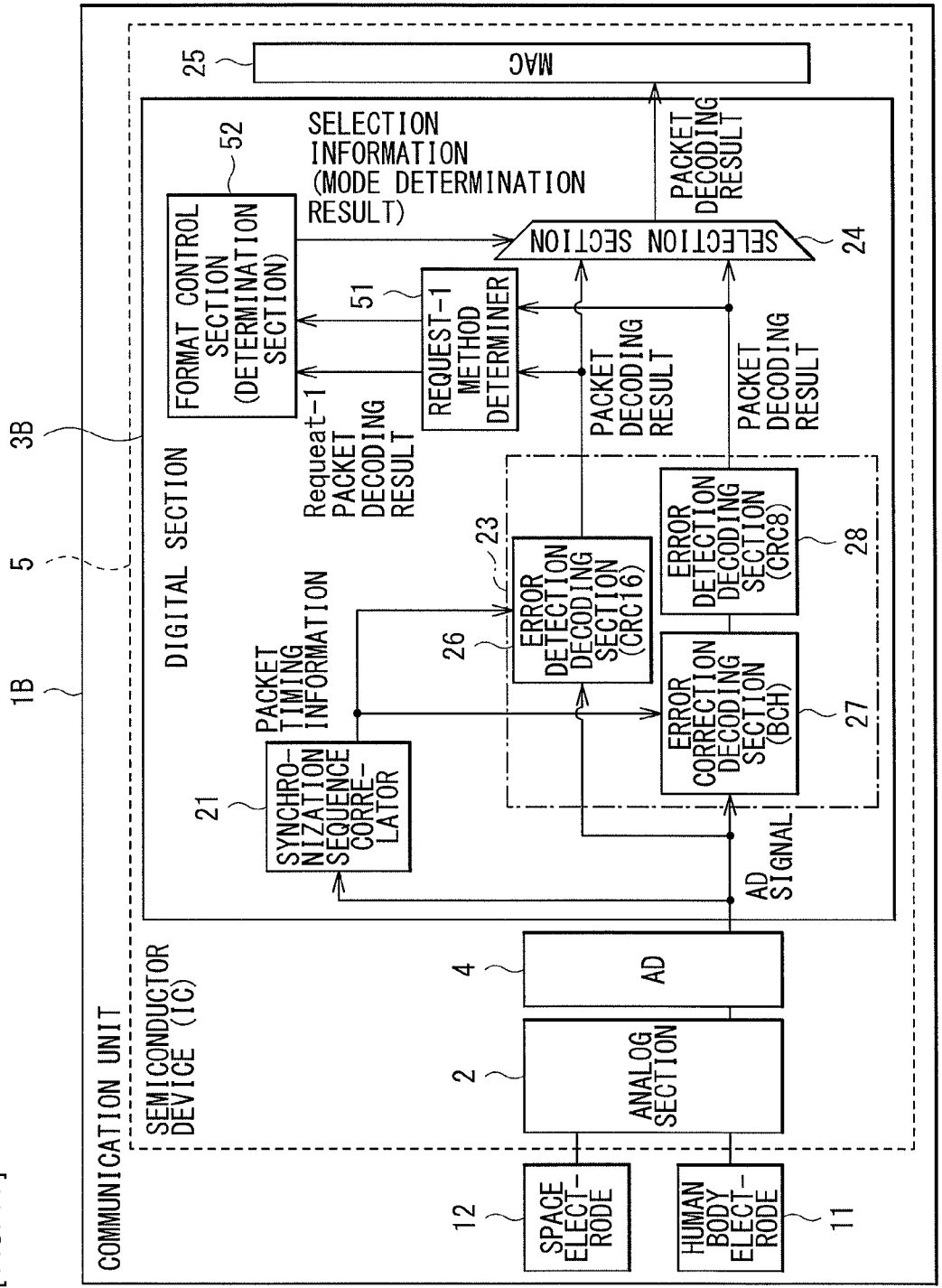
[FIG. 14]

[ FIG. 15 ]
REQUEST-1 PACKET (INITIAL PACKET IN NORMAL METHOD)
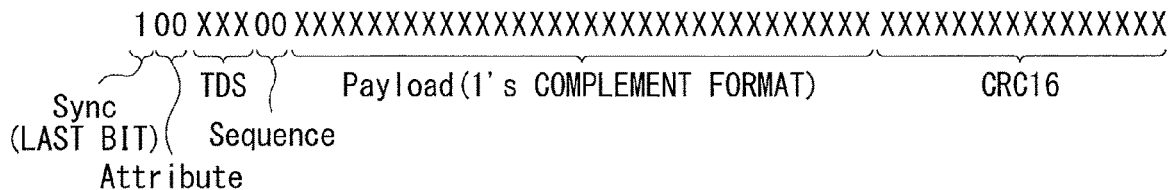
[ FIG. 16 ]
UNIVERSAL SET OF REQUEST-1 PACKET (NORMAL METHOD)
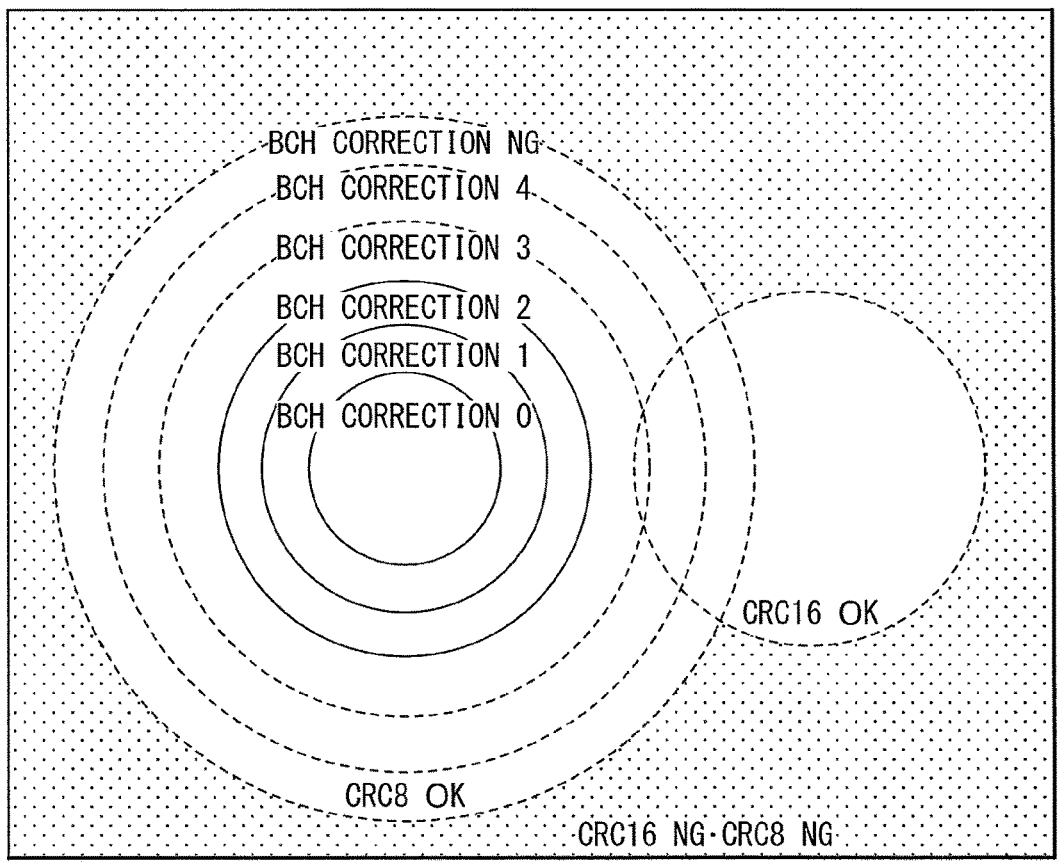

[ FIG. 17 ]

```
4 PATTERNS OF CASE WHERE PACKET IS DECODABLE BY CRC8 WITH
ERROR CORRECTION NUMBER 3 (BCH OK (3) + CRC8 OK), AMONG
PACKETS IN NORMAL METHOD THAT ARE EACH EFFECTIVE AS
REQUEST-1 PACKET
1 00 000 00 10110111100000000100100001111111 1010001101100111
1 00 000 00 11011100001110100010001111000101 0000110011010101
1 00 101 00 11100100001110000001101111000111 1110101010111101
1 00 101 00 00100011011010011101110010010110 1010010011011101
```

[ FIG. 18 ]

```
53 PATTERNS OF CASE WHERE PACKET IS DECODABLE BY CRC8 WITH
ERROR CORRECTION NUMBER 4 (BCH OK (4) + CRC8 OK), AMONG
PACKETS IN NORMAL METHOD THAT ARE EACH EFFECTIVE AS
REQUEST-1 PACKET
1 00 000 00 11100110100010000001100101110111 1011010111001111
1 00 000 00 10101100110001000101001100111011 1011000001111011
1 00 000 00 00101100000011101101001111110001 1110111111101011
1 00 000 00 00001000101000011111011101011110 0000110111011110
1 00 000 00 00010100101001111110101101011000 1100110100110011
1 00 100 00 10001110011110000111000110000111 1110001101001010
1 00 100 00 11101100100001000001001101111011 1000001000011000
1 00 100 00 10011011010011000110010010110011 1101011110011100
1 00 100 00 00011111110110011100000000010011 0001111101111111
1 00 100 00 11110011100001100000110001111001 0001000000111110
1 00 100 00 01110000111111010001111000000001 1001011000100111
1 00 100 00 00011010000000011110010111111110 1001001000101100
1 00 100 00 10111111111010010100000000010110 0101001100100010
1 00 100 00 00101001100100111101011001101100 1100000001111101
1 00 010 00 11101111001101000001000011001011 0001001111000100
1 00 010 00 11011100001001001000011110101 0000111111111111
1 00 010 00 11000110011101100011100110001001 0111000011001000
1 00 010 00 00111111011011101100000010010001 1100110001010000
1 00 010 00 10110100111111100100101100000001 0011001110010101
1 00 010 00 00110010111010011100110100010110 1101110000101111
1 00 110 00 01001011001011101011010011010001 1101000101111010
1 00 110 00 10000000011010110111111110010100 0101100001010011
1 00 110 00 11010000110101100101111000101000 1000100100000101
1 00 110 00 11100011110001110001110000111000 0111100010111111
1 00 110 00 01000110001011110111100111010000 1011100110110001
(TO BE CONTINUED)
```

[ FIG. 19 ]

```
53 PATTERNS OF CASE WHERE PACKET IS DECODABLE BY CRC8 WITH
ERROR CORRECTION NUMBER 4 (BCH OK (4) + CRC8 OK), AMONG
PACKETS IN NORMAL METHOD THAT ARE EACH EFFECTIVE AS
REQUEST-1 PACKET
(CONTINUED
1 00 001 00 10111111001111000100000011000011 1100101111000010
1 00 001 00 10100100111111000101101100000011 1110111001001000
1 00 001 00 11100101001011100001101011010001 0010100001010110
1 00 001 00 10001110001000010111000111011110 0110010110010101
1 00 001 00 10110001110100010100111000101110 1000010001110100
1 00 001 00 00010101011101011101010100001010 1110000101111011
1 00 001 00 10011111010000110110000010111100 1000000100101011
1 00 001 00 01100100101000111001101101011100 1001001001011101
1 00 001 00 01111010000100111000010111101100 0101001011111000
1 00 101 00 10111101100110000100001001100111 1101000010100000
1 00 101 00 01111101101010101000001001010101 1100100010000100
1 00 101 00 00000101010111111111010101010000 1111110100101101
1 00 011 00 11001111100001000110000001111101 0111010101000001
1 00 011 00 11011100001001001000011101101 1000110111111001
1 00 011 00 00100110001101101101100111001001 0011100011111111
1 00 011 00 10110110111111001001001000000001 0011000110011001
1 00 011 00 00001100101000111111001101011100 1100111011100010
1 00 011 00 01101000111010111001011100010100 1110011111101111
1 00 111 00 00010100100010001110101101110111 0011110100111000
1 00 111 00 11101001101000000101100010111 0101111010101101
1 00 111 00 01111110001110010000001110000011 0010110111000000
1 00 111 00 01101111011110010010000010000011 1101101001000011
1 00 111 00 01101100110101010001001100101011 1111011111110111
1 00 111 00 10110101110110100100101000100101 1100010110101100
1 00 111 00 00111000110111011000011100010001 1000111110000011
1 00 111 00 00110001111101111100111000001000 0011010001100001
1 00 111 00 11100000110111100001111001000 0000011100111101
1 00 111 00 11101110110111110001000100100000 1100011110011000
```

[ FIG. 20 ]
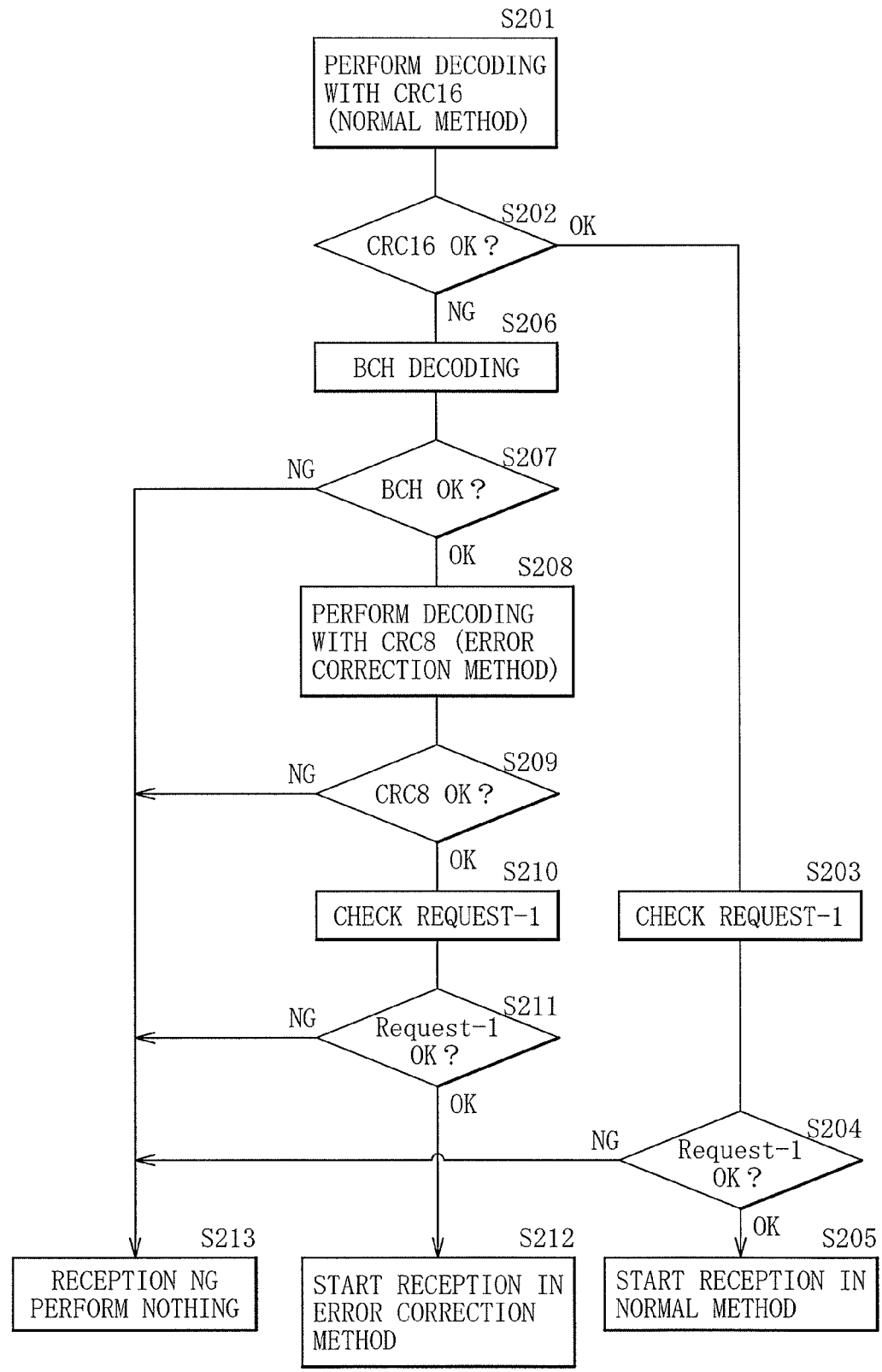

[ FIG. 21 ]
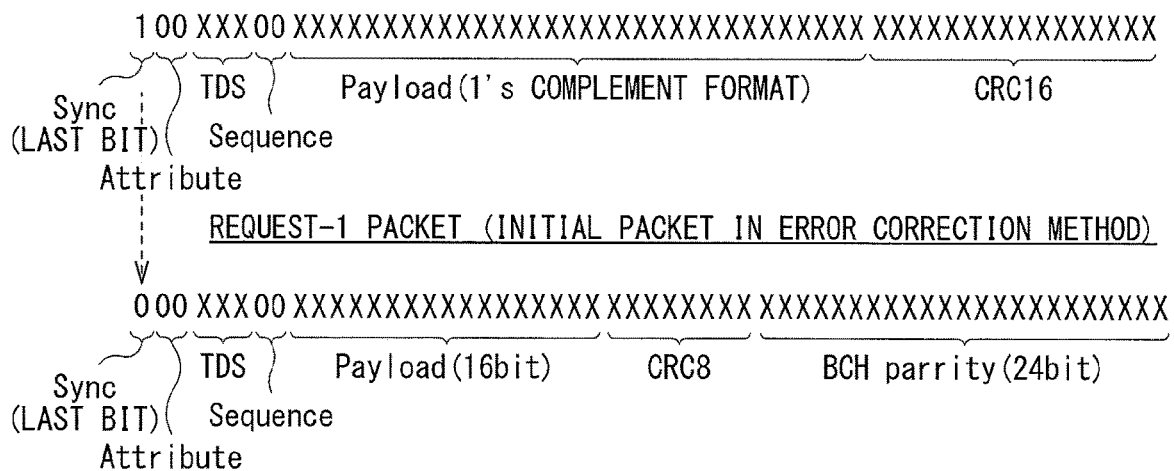
[ FIG. 22 ]
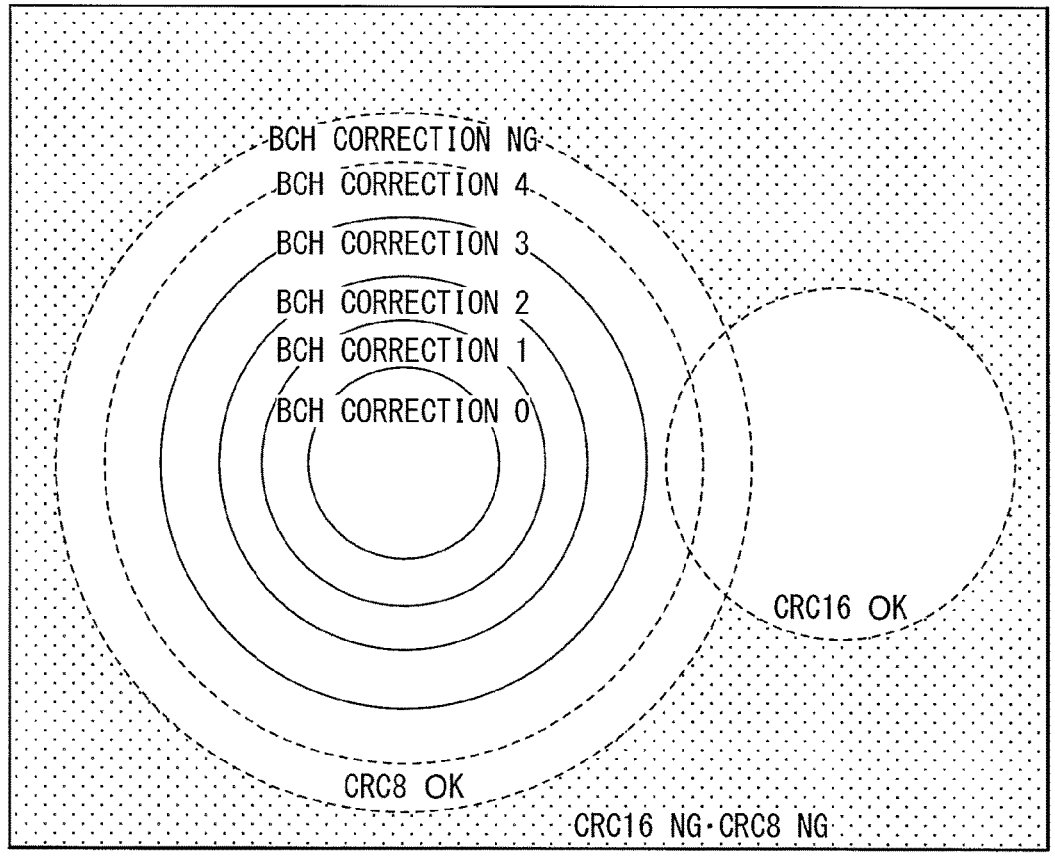

[ FIG. 23 ]

```
44 PATTERNS OF CASE WHERE PACKET IS DECODABLE BY CRC8 WITH
ERROR CORRECTION NUMBER 4 (BCH OK (4) + CRC8 OK), AMONG
PACKETS IN NORMAL METHOD THAT ARE EACH EFFECTIVE AS REQUEST-1
PACKET
1 00 000 00 10110100101111000100101101000011 00101010111110011
1 00 000 00 11101111000111100001000011100001 1101010111000110
1 00 000 00 10101010011011110101010110010000 0111010010101000
1 00 100 00 00100110010100001101100110101111 1001001000100101
1 00 100 00 01101010111001001001010100011011 0011111001001010
1 00 100 00 11000101011110100011101010000101 0000110011011101
1 00 100 00 00001011101100011111010001001110 1001011001011001
1 00 100 00 10011100100001010110001101111010 1110111100100101
1 00 010 00 01110011011000001000110010011111 0101111110010000
1 00 010 00 11001101000001000011001011111011 0101101010010000
1 00 010 00 01011110110101001010000100101011 1110010010000010
1 00 010 00 01011011100011101010010001110001 1100010110000010
1 00 010 00 10011111110110010110000000100110 1001011100001011
1 00 010 00 01101011100001011001010001111010 1010110101100100
1 00 010 00 10100101001011010101101011010010 1010100100011110
1 00 010 00 11010011011011110010110010010000 0111010101000110
1 00 110 00 00111001101111001100011001000011 1010010111111110
1 00 110 00 01101000101000111001011101011100 0001011101110011
1 00 110 00 01100001110101111001111000101000 0110010001000111
1 00 110 00 01111110111111111000000100000000 0011001001001110
(TO BE CONTINUED)
```

[ FIG. 24 ]

```
44 PATTERNS OF CASE WHERE PACKET IS DECODABLE BY CRC8 WITH
ERROR CORRECTION NUMBER 4 (BCH OK (4) + CRC8 OK), AMONG
PACKETS IN NORMAL METHOD THAT ARE EACH EFFECTIVE AS REQUEST-1
PACKET
(CONTINUED
1 00 001 00 00101110101010101101000101010101 0111100111010101
1 00 001 00 00101000001101101101011111001001 1011101110000111
1 00 001 00 00000001111011101111111000010001 0100010110000000
1 00 001 00 11001100001000010011001111011110 1000110111001111
1 00 001 00 10100000011000110101111110011100 1100111000100011
1 00 001 00 11110001001011100001110110100000 0001000110100110
1 00 001 00 11111101110111110000001000100000 0001011110110100
1 00 101 00 00010100111000001110101100011111 1110000001110001
1 00 101 00 11100100001100000001101111001111 1100001000010100
1 00 101 00 00111000011111001100011110000011 1001010011101011
1 00 101 00 10011110100100100110000101101101 0100100100001100
1 00 101 00 10001101100100100111001001101101 1001111101010111
1 00 101 00 10111011110110110100010000100100 0110000111000101
1 00 101 00 11000101010011110011101010110000 1100110101111000
1 00 011 00 11011100100001000010001101111011 0010010000010101
1 00 011 00 10110101000110100100101011100101 0011111001001101
1 00 011 00 01001111011101101011000010001001 0111011010000001
1 00 011 00 00010110001001111110100111011000 0110011111000000
1 00 011 00 01010001011101111010111010001000 1100100000010001
1 00 111 00 10010011011100000110110010001111 0001011111000110
1 00 111 00 11011000111010000100111110001011 0010101000110111
1 00 111 00 00100000100000101101111101111101 0111010011111010
1 00 111 00 11001111101101000110000000100101 0000100011100000
1 00 111 00 00010011101101011110110001001010 1001010110001000
```

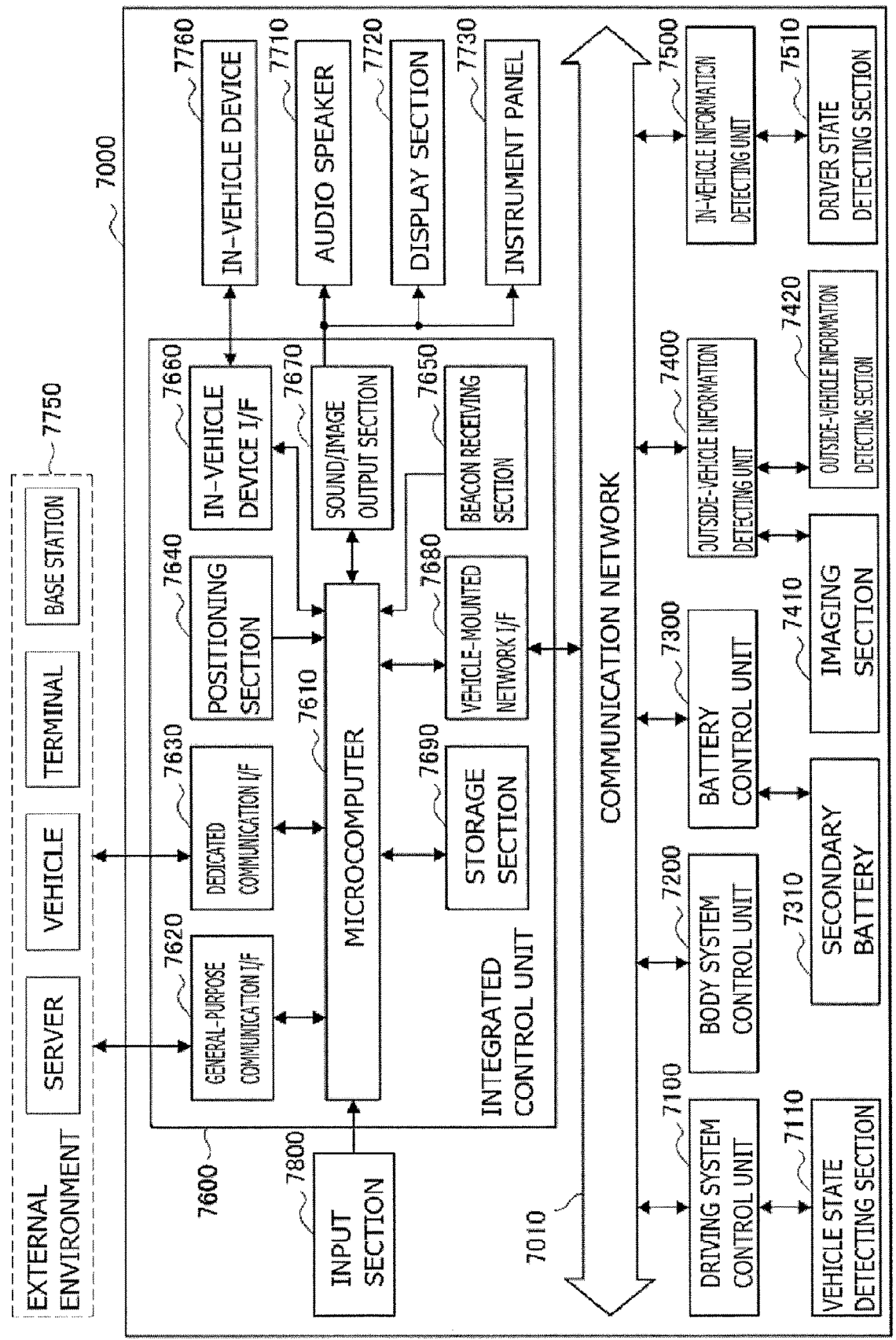
[FIG.25]

[ FIG. 26 ]
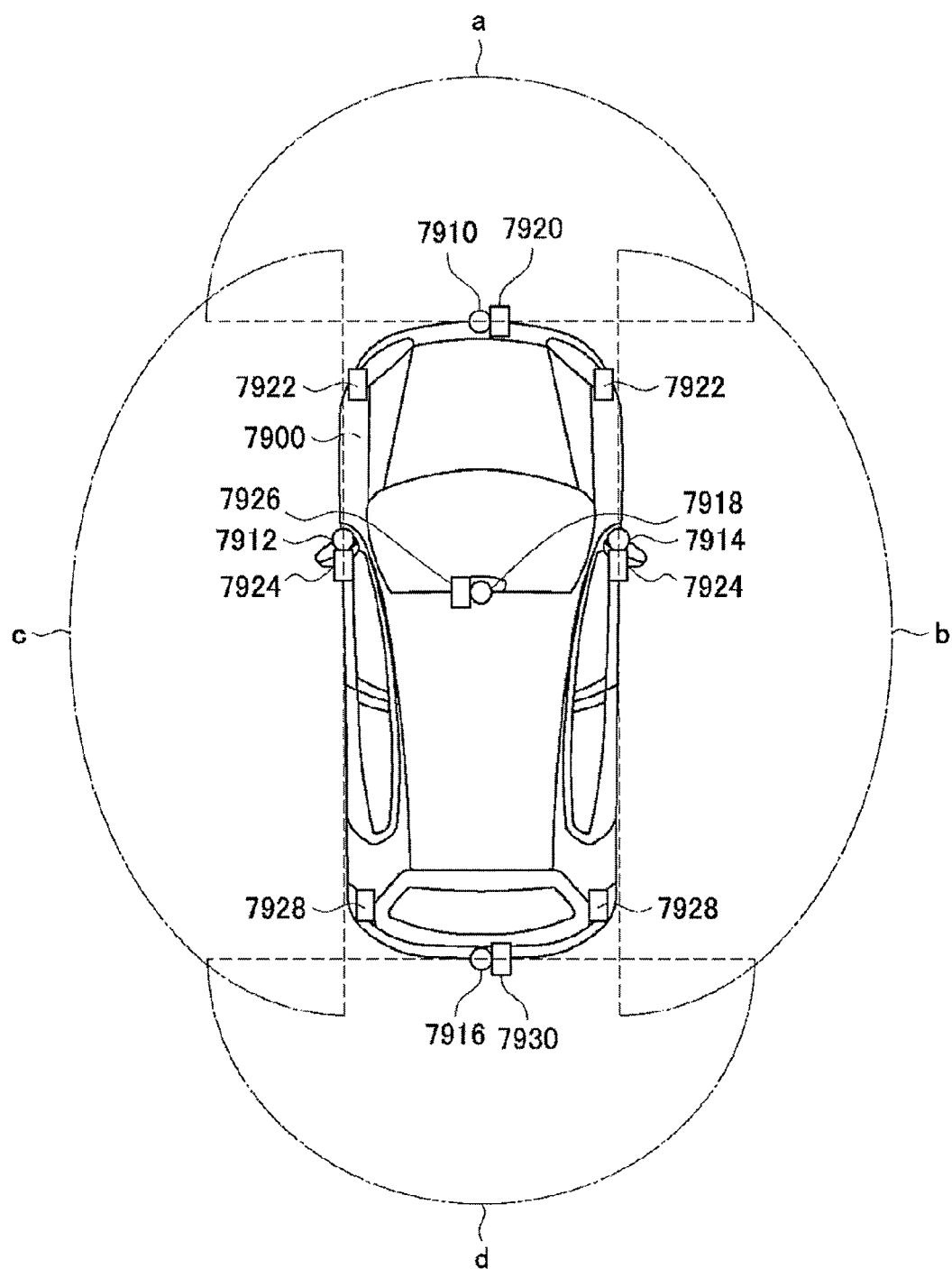

COMMUNICATION UNIT AND COMMUNICATION SYSTEM

TECHNICAL FIELD

The present disclosure relates to a communication unit and a communication system that are suitable for electric field communication.

BACKGROUND ART

There is known a communication system that utilizes an electric field communication technique using, for example, a human body as a communication medium.

CITATION LIST

Patent Literature

PTL 1: Japanese Unexamined Patent Application Publication No. 2009-21941
PTL 2: Japanese Unexamined Patent Application Publication No. 2005-311608

SUMMARY OF THE INVENTION

In a communication system that utilizes an electric field communication technique, communication performance may decrease due to deterioration of a communication environment such as existence of a noise source.

It is desirable to provide a communication unit and a communication system that make it possible to enhance communication performance.

A communication unit according to an embodiment of the present disclosure includes: a decoding section configured to decode transfer data transmitted from a communicated unit, by a first method using a first error detecting code, and a second method using at least an error correcting code; and a determination section that performs determination as to whether the transfer data are data in the first method including the first error detecting code or data in the second method including the error correcting code.

A communication system according to an embodiment of the present disclosure includes: a first communication unit that transmits transfer data; and a second communication unit that receives the transfer data, the second communication unit including a decoding section configured to decode the transfer data, by a first method using a first error detecting code and a second method using at least an error correcting code, and a determination section that performs determination as to whether the transfer data are data in the first method including the first error detecting code or data in the second method including the error correcting code.

In the communication unit or the communication system according to the embodiment of the present disclosure, determination is made as to whether the transfer data are the data in the first method including the first error detecting code or the data in the second method including the error correcting code.

According to the communication unit or the communication system in the embodiment of the present disclosure, the transfer data are decodable by the first method using the first error detecting code and the second method using at least the error correcting code, and determination is made as to whether the transfer data are the data in the first method or the data in the second method, thus making it possible to enhance communication performance.

It is to be noted that effects described here are not necessarily limitative, and may be any of effects described in the present disclosure.

BRIEF DESCRIPTION OF DRAWINGS

FIG. 1 is a configuration diagram illustrating an outline of a communication system according to a comparative example that utilizes an electric field communication technique and uses a human body as a communication medium.

FIG. 2 is a configuration diagram illustrating an outline of a communication system according to the comparative example.

FIG. 3 is an explanatory diagram schematically illustrating an example of a reception signal in a case where a display is turned off.

FIG. 4 is an explanatory diagram schematically illustrating an example of a reception signal in a case where the display is turned on.

FIG. 5 is an explanatory diagram schematically illustrating an example of attenuation of a signal level in the communication system according to the comparative example.

FIG. 6 is a block diagram schematically illustrating a configuration example of a communication unit according to a first embodiment of the present disclosure.

FIG. 7 is an explanatory diagram schematically illustrating an example of a packet configuration of data in a normal method (a first method).

FIG. 8 is an explanatory diagram schematically illustrating an example of a packet configuration of data in an error correction method (a second method).

FIG. 9 is an explanatory diagram schematically illustrating an example of each of synchronization (Sync) data in the normal method and synchronization (Sync) data in the error correction method.

FIG. 10 is an explanatory diagram schematically illustrating an example of a signal waveform of a Manchester code.

FIG. 11 is a configuration diagram schematically illustrating a configuration example of a communication unit according to a modification example of the first embodiment.

FIG. 12 is an explanatory diagram schematically illustrating a relationship between a signal inputted to a detection section in the communication unit according to the modification example of the first embodiment and a threshold.

FIG. 13 is a flowchart schematically illustrating an example of processing depending on a detection result of the detection section in the communication unit according to the modification example of the first embodiment.

FIG. 14 is a block diagram schematically illustrating a configuration example of a communication unit according to a second embodiment.

FIG. 15 is an explanatory diagram schematically illustrating an example of a Request-1 packet in the normal method.

FIG. 16 is an explanatory diagram schematically illustrating a set of decoding results of the Request-1 packet in the normal method.

FIG. 17 is an explanatory diagram illustrating data decodable by a CRC8 with an error correction number 3, among packets in the normal method that are each effective as a Request-1 packet.

FIG. 18 is an explanatory diagram illustrating data decodable by the CRC8 with an error correction number 4, among the packets in the normal method that are each effective as a Request-1 packet.

FIG. 19 is an explanatory diagram illustrating the data decodable by the CRC8 with the error correction number 4, among the packets in the normal method that are each effective as a Request-1 packet.

FIG. 20 is a flowchart schematically illustrating an example of determination processing for a communication method in the communication unit according to the second embodiment.

FIG. 21 is an explanatory diagram schematically illustrating an example of each of a Request-1 packet in the normal method and a Request-1 packet in the error correction method, in a third embodiment.

FIG. 22 is an explanatory diagram schematically illustrating a set of decoding results of a Request-1 packet in the normal method in a case where the Request-1 packet in FIG. 21 is used.

FIG. 23 is an explanatory diagram illustrating data decodable by a CRC8 with an error correction number 4, among packets in the normal method that are each effective as a Request-1 packet, in a case where the Request-1 packet in FIG. 21 is used.

FIG. 24 is an explanatory diagram illustrating the data decodable by the CRC8 with the error correction number 4, among the packets in the normal method that are each effective as a Request-1 packet, in the case where the Request-1 packet in FIG. 21 is used.

FIG. 25 is a block diagram depicting an example of schematic configuration of a vehicle control system.

FIG. 26 is a diagram of assistance in explaining an example of installation positions of an outside-vehicle information detecting section and an imaging section.

MODES FOR CARRYING OUT THE INVENTION

Some embodiments of the present disclosure are described below in detail with reference to the drawings. It is to be noted that the description is given in the following order.

0. Comparative Example (An outline and an issue of a communication system using a human body as a communication medium) (FIG. 1 to FIG. 5)
1. First Embodiment (A communication unit that uses synchronization data for determination of a communication method)
    1.1 Configuration and Operation of Communication Unit according to First Embodiment (FIG. 6)
    1.2 Details of Packet Configuration of Transfer Data (FIG. 7 to FIG. 10)
    1.3 Effects
    1.4 Modification Example (A communication unit that performs correction processing for a signal) (FIG. 11 to FIG. 13)
2. Second Embodiment (A communication unit that uses an error detecting code for determination of a communication method)
    2.1 Configuration and Operation of Communication Unit according to Second Embodiment (FIG. 14)
    2.2 Details of Determination of Communication Method (FIG. 15 to FIG. 20)
3. Third Embodiment (A communication unit that uses synchronization data and an error detecting code for determination of a communication method) (FIG. 21 to FIG. 24)
4. Fourth Embodiment (An application example) (FIG. 25 to FIG. 26)
5. Other Embodiments

0. Comparative Example (Outline of Communication System Using Human Body as Communication Medium)

FIG. 1 and FIG. 2 each illustrate an outline of a communication system according to a comparative example that utilizes an electric field communication technique and uses a human body 30 as a communication medium.

A communication system 100 according to this comparative example includes a first communication unit 110 and a second communication unit 120.

The communication system 100 may be utilized for communication between a communication apparatus mounted on a wearable apparatus such as a smart watch 93 and a wristband, and a communication apparatus mounted on a doorknob 91 of a door 90, a smartphone 92, etc., as illustrated in, for example, FIG. 2. For example, one of the first communication unit 110 and the second communication unit 120 may be provided at the smart watch 93, etc., and the other may be provided at the smartphone 92, etc.

The first communication unit 110 includes a first antenna section 115 and a first communication section 113. The first antenna section 115 includes a first human body electrode 111 and a first space electrode 112. The first communication section 113 is coupled to a host 114.

The second communication unit 120 includes a second antenna section 125 and a second communication section 123. The second antenna section 125 includes a second human body electrode 121 and a second space electrode 122. The second communication section 123 is coupled to a host 124.

The first communication section 113 and the second communication section 123 each include a communication circuit employing an electric field communication method.

The first communication section 113 may include at least a transmission circuit. The second communication section 123 may include at least a reception circuit. The first communication section 113 and the second communication section 123 may each include a transmitter-receiver circuit, and interactive communication may be possible between the first communication unit 110 and the second communication unit 120.

In a case where a signal is transmitted from the first communication unit 110, the first communication section 113 generates a transmission signal of a potential difference including a signal modulated by a predetermined modulation system, between the first human body electrode 111 and the first space electrode 112. The first human body electrode 111 is disposed on side closer to the human body 30 than the first space electrode 112. The first human body electrode 111 is thereby disposed to have stronger capacitive coupling to the communication medium (the human body) 30 than the first space electrode 112.

In this communication system, by bringing a portion of the human body 30 closer to the second human body electrode 121 than to the second space electrode 122, a human-body-side communication path that uses the human body 30 as a communication medium 30 is formed between the first human body electrode 111 and the second human body electrode 121. In addition, a space-side communication path that uses a space (e.g., air) as a communication medium is formed between the first space electrode 112 and the second space electrode 122.

A potential difference corresponding to a transmission signal transferred through the communication medium (the human body) 30 is generated between the second human body electrode 121 and the second space electrode 122. The second communication section 123 detects the potential difference generated between the second human body electrode 121 and the second space electrode 122, performs demodulation processing corresponding to the modulation system of the first communication section 113 to generate a reception signal, and outputs the reception signal as an output signal.

In the electric field communication, when a person touches or approaches a human body electrode, an electric field E is thereby distributed over a human body surface to perform communication, as illustrated in FIG. 2. For this reason, communication is possible only in close proximity to the human body 30. In addition, compatibility with a wearable device is high.

Examples of a standard of the electric field communication as described above include ISO/IEC 17982 CCCC PHY (Closed Capacitive Coupling Communication Physical Layer). The ISO/IEC 17982 CCCC PHY (hereinafter referred to as CCCC-PHY) adopts automatic retransmission control (ARQ; Automatic Repeat reQuest) using an error detecting code and retransmission control.

(Issue)

In the communication system that utilizes the electric field communication technique as described above, communication performance may decrease due to deterioration of a communication environment.

For example, as illustrated in FIG. 2, in a case where the smart watch 93, etc. is attached as the first communication unit 110 to one of right and left hands, and the smartphone 92, etc. mounted with the second communication unit 120 is operated with the other hand, a communication path is longer than in a case where the smartphone 92, etc. is operated with the one hand. At the time of such communication with the opposite hand, signal power significantly attenuates in the human body 30 serving as the communication path, and thus a level of a reception signal on side of the other hand may be much smaller than a level of a transmission signal on side of the one hand, as illustrated in FIG. 5.

Further, for example, in a case where the communication system is applied to an apparatus mounted with a display such as the smartphone 92, the display may become a noise source. In that case, communication may be difficult because of noise included in a reception signal.

FIG. 3 and FIG. 4 each illustrate an example of a reception signal in a case where the communication system is applied to an apparatus mounted with a display. FIG. 3 illustrates an example of a reception signal in a case where the display is turned off, and FIG. 4 illustrates an example of a reception signal in a case where the display is turned on. FIG. 3 and FIG. 4 each illustrate a case where a time division slot (TDS) packet is received as a reception signal. As illustrated in FIG. 4, in the case where the display is turned on, spike-like noise with power greater than that of a signal component may be generated. The standard of the CCCC-PHY defines decoding using an error detecting code. In a case where large noise is generated, however, an error may be detected almost every time, as a result of decoding using the error detecting code.

Incidentally, there is known Hybrid Automatic Repeat reQuest (HARQ), etc. in which an error correction technique and automatic retransmission control are combined as a technique of improving communication performance. However, in the standard of the CCCC-PHY, an error correction technique is not defined, although an error detection technique is defined. For this reason, in a case where a technique of error correction is introduced, it may be necessary to distinguish between a normal communication method defined by the typical CCCC-PHY and a communication method in which error correction is introduced.

As a technique of distinguishing between communication methods, a method of adding information indicating whether to allow error correction to a header, etc. of packet data is conceivable. Meanwhile, P-PDU (Protocol Data Unit) that is a PHY packet defined by the CCCC-PHY is provided with Attribute (an attribute), TDS Number, and Sequence Number (a number for retransmission) as control headers, other than Payload that is actual data. However, uses of these control headers are decided in the standard, and thus there is no extensibility. This makes it difficult to add information that distinguishes between communication methods.

The present disclosure provides a technique that makes it possible to enhance communication performance by introducing a technique of error correction. In addition, to introduce the technique of error correction, there is provided a technique that makes it possible to distinguish between a normal communication method defined by the typical CCCC-PHY and a communication method that uses an error correcting code, on transfer-data receiving side. In particular, it is desirable to provide a technique that makes it possible to distinguish between two methods without losing extensibility of a control header defined by the CCCC-PHY.

1. First Embodiment

1.1 Configuration and Operation of Communication Unit According to First Embodiment FIG. 6 schematically illustrates a configuration example of a communication unit 1 according to a first embodiment of the present disclosure.

The communication unit 1 according to the present embodiment includes an analog section 2, a digital section 3, an analog-digital (AD) conversion section 4, a human body electrode 11, a space electrode 12, and a media access control (MAC) section 25. The analog section 2, the digital section 3, and the AD conversion section 4 may be configured as one semiconductor device (IC) 5.

The communication unit 1 may be applied to one or both of the first communication unit 110 and the second communication unit 120 in the communication system 100 according to the above-described comparative example. One of the first communication unit 110 and the second communication unit 120 may be provided as a communicated unit that transmits transfer data to the communication unit 1. Further, the other of the first communication unit 110 and the second communication unit 120 may be the communication unit 1 that receives the transfer data from the communicated unit.

The human body electrode 11 and the space electrode 12 may be configured substantially similarly to the first human body electrode 111 and the first space electrode 112, or the second human body electrode 121 and the second space electrode 122, in the communication system 100 according to the foregoing comparative example.

The analog section 2 detects a signal received by the human body electrode 11 and the space electrode 12, and outputs the detected signal to the AD conversion section 4. The analog section 2 may include a filter, etc. that limits a signal band.

The AD conversion section 4 outputs, as the transfer data, the signal detected by the analog section to the digital section 3.

The MAC section 25 is an interface between the digital section 3 and an external network apparatus such as a host.

The digital section 3 includes a normal-mode correlator 21A, an error-correction-mode correlator 21B, a maximum detection section 22, a decoding section 23, and a selection section 24.

The decoding section 23 includes an error detection decoding section 26, an error correction decoding section 27, and an error detection decoding section (28.

The decoding section 23 is configured to be able to decode the transfer data, by a normal method (a first method) that uses a first error detecting code defined by the CCCC-PHY, and an error correction method (a second method) that uses a second error detecting code and an error correcting code. The error detection decoding section 26 is a decoding section for the normal method. The error correction decoding section 27 and the error detection decoding section 28 are decoding sections for the error correction method.

The error detection decoding section 26 and the error detection decoding section 28 each perform decoding using a cyclic redundancy check (CRC) as the error detecting code. The error detection decoding section 26 performs decoding in which a CRC with a generator polynomial of 16 bits (a CRC16) is used as the first error detecting code. The error detection decoding section 28 performs decoding in which a CRC with a generator polynomial of 8 bits (a CRC8) is used as the second error detecting code.

The error correction decoding section 27 performs decoding in which a Bose Chaudhuri Hocquenghem (BCH) code is used as the error correcting code.

The normal-mode correlator 21A detects a correlation between the transfer data and a first known signal for normal-method determination. It is to be noted that the first known signal may include first synchronization (Sync) data as described later.

The error-correction-mode correlator 21B detects a correlation between the transfer data and a second known signal for error-correction-method determination. It is to be noted that the second known signal may include second synchronization data as described later.

The maximum detection section 22 is a determination section that determines a method (mode) for the transfer data, i.e., whether the transfer data are data in the normal method including the first error detecting code or data in the error correction method including the error correcting code, on the basis of a result of the correlation detected by the normal-mode correlator 21A and the error-correction-mode correlator 21B. The maximum detection section 22 outputs, as selection information, a mode determination result to the selection section 24. In addition, the maximum detection section 22 outputs packet timing information provided to determine a head of a packet to the error detection decoding section 26 and the error correction decoding section 27.

The selection section 24 selectively outputs the transfer data decoded by one of the normal method and the error correction method, on the basis of the determination result of the maximum detection section 22.

1.2 Details of Packet Configuration of Transfer Data

FIG. 7 schematically illustrates an example of a packet configuration of data in the normal method. A packet of data in the normal method is a P-PDU packet of the CCCC-PHY.

The packet of the data in the normal method includes a pre-amble, synchronization (Sync) data serving as first synchronization data, a control header group, a Payload of 32 bits that is actual data, and a CRC code of 16 bits serving as the first error detecting code. The control header group includes Attribute (an attribute), TDS Number, and Sequence Number (a number for retransmission). A target for error detection by the CRC code in the data in the normal method ranges from the last bit of the synchronization data to the Payload.

FIG. 8 schematically illustrates an example of a packet configuration of data in the error correction method.

A packet of data in the error correction method includes a pre-amble, synchronization (Sync) data serving as second synchronization data, a control header group, a Payload of 16 bits that is actual data, a CRC code of 8 bits serving as the second error detecting code, and a BCH code of 24 bits serving as the error correcting code. The control header group includes Attribute (an attribute), TDS Number, and Sequence Number (a number for retransmission).

A generator polynomial of the CRC code in the data in the error correction method is, for example, $g(x)=x^8+x^7+x^3+x^2+1$.

A primitive polynomial of the BCH code in the data in the error correction method is, for example, $g(x)=x^6+x+1$.

A target for error detection by the CRC code in the data in the error correction method ranges from the last bit of the synchronization data to the Payload. A target for error correction by the BCH code ranges from the last bit of the synchronization data to the CRC code.

In the data in the above-described packet configuration in each of the methods, each of the pre-amble and the synchronization data is a known signal. In the present embodiment, a correlation between the transfer data and the known signal in each of the methods is detected by the normal-mode correlator 21A and the error-correction-mode correlator 21B. The maximum detection section 22 determines the method of the transfer data, on the basis of a result of the detected correlation.

FIG. 9 schematically illustrates an example of each of the synchronization data (the first synchronization data) in the normal method and the synchronization data (the second synchronization data) in the error correction method. FIG. 10 schematically illustrates an example of a signal waveform of a Manchester code.

Both of the data in the normal method and the data in the error correction method may be modulated by the Manchester code. In the Manchester code, as illustrated in FIG. 10, in a case where a waveform has a first half being high and a latter half being low of a predetermined period T, a bit has a value defined as 1 (one). In addition, in a case where a waveform has a first half being low and a latter half being high of the predetermined period T, a bit has a value defined as 0 (zero).

The synchronization data in the normal method is known data defined by the CCCC-PHY. The CCCC-PHY defines data in a pattern P indicating a positive polarity and data in a pattern Q indicating a negative polarity, both as the pre-amble and as the synchronization data. The last bit of the data (the last bit of the synchronization data) in the pattern P has a value of 1 (one), and the last bit of the data (the last bit of the synchronization data) in the pattern Q has a value of 0 (zero).

The synchronization data in the error correction method in the present embodiment are data in which the last bit has a value different with respect to the synchronization data in the normal method. Specifically, the value of the last bit is inverted with respect to the synchronization data in the normal method, such that the value of the last bit of the data (the last bit of the synchronization data) in a pattern P is 0 (zero), and the value of the last bit of the data (the last bit of the synchronization data) in a pattern Q is 0 (zero).

This makes it possible to detect which one of the first synchronization data and the second synchronization data is included in the transfer data by means of the normal-mode correlator 21A, the error-correction-mode correlator 21B, and the maximum detection section 22, and thereby to determine whether the transfer data are the data in the normal method or the data in the error correction method. Further, originally, in the CCCC-PHY, the last bit of the synchronization data is treated as a portion of an information length of the error detecting code, and thus, it is possible to protect a value to be used for determination, by means of the error detection and the error correction.

1.3 Effects

As described above, according to the present embodiment, the transfer data are decodable by the first method using the first error detecting code and the second method using at least the error correcting code, and determination is made as to whether the transfer data are the data in the first method or the data in the second method, thus making it possible to enhance communication performance.

According to the present embodiment, it is possible to distinguish between the two methods without losing extensibility of the control header defined by the CCCC-PHY. This makes it possible to enhance communication performance by introducing a technique of error correction.

It is to be noted that the effects described herein are merely illustrative and not limitative, and may have other effects. This also holds true for effects of other embodiments as described hereinbelow.

1.4 Modification Example

FIG. 11 schematically illustrates a configuration example of a communication unit 1A according to a modification example of the first embodiment.

The communication unit 1A according to the modification example further includes a detection section 50 within a digital section 3A, as compared with the communication unit 1 illustrated in FIG. 6.

The detection section 50 detects an abnormality of the received transfer data.

FIG. 12 schematically illustrates a relationship between a signal to be inputted to the detection section 50 and a threshold.

The detection section 50 may detect an abnormality on the basis of a signal level of the input signal. The decoding section 23 performs correction processing, when there is an abnormality in the decoded transfer data. The communication unit 1A may include a storage section that stores information for abnormality detection. The information for abnormality detection may be threshold information with respect to a signal level.

FIG. 13 illustrates an example of a flow of processing of the communication unit 1A depending on a detection result of the detection section 50.

The detection section 50 determines whether or not an input signal is outside a predetermined threshold range (step S101). In a case where the detection section 50 determines that the input signal is outside the predetermined threshold range (step S101; Y), the decoding section 23 performs correction processing (step S102).

In contrast, in a case where the detection section 50 determines that the input signal is not outside the predetermined threshold range (step S101; N), the decoding section 23 performs normal processing (step S103). In other words, the decoding section 23 performs decoding without performing the correction processing.

It is to be noted that FIG. 11 illustrates a configuration example where the detection section 50 provided within the digital section 3A detects the abnormality of the signal level in the AD conversion section 4 and thereafter, but the detection section 50 may be provided outside the digital section 3A. Further, the detection section 50 may be configured to detect an abnormality of a signal at a stage before the AD conversion section 4.

Furthermore, the detection section 50 may be provided inside or may be provided outside the semiconductor device 5.

Moreover, the detection section 50 may be configured to be integral with a component that is a portion of the digital section 3A.

Other configurations, operation, and effects may be substantially similar to those of the communication unit 1 according to the above-described first embodiment.

2. Second Embodiment

Next, a communication system according to a second embodiment of the present disclosure is described. It is to be noted that, in the following, the same components as those of the communication system according to the above-described first embodiment are denoted by the same reference numerals, and the descriptions thereof are omitted where appropriate.

2.1 Configuration and Operation of Communication Unit According to Second Embodiment FIG. 14 schematically illustrates a configuration example of a communication unit 1B according to the second embodiment of the present disclosure.

The communication unit 1B according to the present embodiment includes a synchronization sequence correlator 21, a Request-1 method determiner 51, and a format control section 52 within the digital section 3B, in place of the normal-mode correlator 21A, the error-correction-mode correlator 21B, and the maximum detection section 22 in the communication unit 1 according to the above-described first embodiment.

A packet configuration of data in the normal method in the present embodiment may be substantially similar to the packet configuration illustrated in FIG. 7. A packet configuration of data in the error correction method in the present embodiment may be substantially similar to the packet configuration illustrated in FIG. 8. However, in the above-described first embodiment, the values of the respective synchronization data in the data in the normal method and in the data in the error correction method are different from each other, but in the present embodiment, the values of the respective synchronization data in the data in the normal method and in the data in the error correction method may be identical.

The synchronization sequence correlator 21 outputs packet timing information provided to determine a head packet of transfer data, to the error detection decoding section 26 and the error correction decoding section 27.

In the present embodiment as well, the data in the normal method includes a CRC code of 16 bits (a CRC16) serving as a first error detecting code. Further, the data in the error correction method includes a CRC code of 8 bits (a CRC8) serving as a second error detecting code, and a BCH code of 24 bits serving as an error correcting code.

In the present embodiment, on the basis of a result of error detection using the first error detecting code and a result of error detection using the second error detecting code, determination is made as to whether the transfer data are the data in the normal method or the data in the error correction method. Further, in the present embodiment, in a case where the transfer data are packet data of an initial (first) association request (Association Request-1), determination of the communication method is performed.

A decoding result of the transfer data decoded by the normal method using the error detection decoding section 26 is inputted to the Request-1 method determiner 51. Further, a decoding result of the transfer data decoded by the error correction method using the error correction decoding section 27 and the error detection decoding section 28 is inputted to the Request-1 method determiner 51.

A decoding result of a Request-1 packet decoded by the normal method, among the decoded transfer data, is inputted to the format control section 52, through the Request-1 method determiner 51. Further, a decoding result of a Request-1 packet decoded by the error correction method, among the decoded transfer data, is inputted to the format control section 52.

The format control section 52 is a determination section that determines a method (mode) for the transfer data, i.e., whether the transfer data are the data in the normal method or the data in the error correction method, on the basis of the decoding result of the Request-1 packet decoded by the normal method and the decoding result of the Request-1 packet decoded by the error correction method.

In a case where no error is detected as the result of the error detection using the first error detecting code (the CRC16), the format control section 52 may determine that the transfer data are the data in the normal method, as illustrated in FIG. 20 described later. Further, in a case where an error is detected as the result of the error detection using the first error detecting code, the format control section 52 may determine whether or not the transfer data are the data in the error correction method, on the basis of the result of the error detection using the second error detecting (the CRC8), as illustrated in FIG. 20 described later.

It is to be noted that the Request-1 method determiner 51 and the format control section 52 may be configured as one block. Further, the Request-1 method determiner 51 may have a function as the determination section.

The format control section 52 outputs, as selection information, a mode determination result to the selection section 24.

The selection section 24 selectively outputs the transfer data decoded by one of the first method and the second method, on the basis of the determination result of the format control section 52.

2.2 Details of Determination of Communication Method

In the standard of the CCCC-PHY, there are provided such specifications that establishment of logical connection called association is first performed in two phases, when communication of data is performed between communication units. In that case, a transmission side transmits a first association request (Association Request-1), and then transmits a second association request (Association Request-2) in response to a reply from a reception side.

FIG. 15 schematically illustrates an example of a Request-1 packet (an initial packet) in the normal method based on the standard of the CCCC-PHY.

A packet to be established as the Request-1 packet in the normal method has the following restriction.
Attribute=00
Sequence Number=00
Payload has higher 16 bits replaced with 1 (one)'s complement of lower 16 bits (bit inversion).
CRC code is obtained by calculating a CRC16, using Sync last bit, Attribute, TDS Number, Sequence Number, and Payload of 40 bits as inputs.

When the above-described Request-1 packet in the normal method is decoded as the Request-1 packet in the error correction method, this Request-1 packet in the normal method is partially decodable by both of the methods, but the number thereof is limited.

Thus, in the communication unit 1B according to the present embodiment, the Request-1 packet that is the initial packet is decoded by both of the methods, and depending on which one of the methods has successfully performed decoding, communication for the initial packet and thereafter is performed by a communication mode of the method that has successfully performed decoding. In the case of this technique, unlike the above-described first embodiment, it is possible to determine communication methods without performing processing of varying the value of the synchronization data depending on the method.

FIG. 16 illustrates a universal set of decoding results of a case where the Request-1 packet in the normal method is decoded as a packet in the error correction method. In FIG. 16, for example, as a result of error detection by the CRC16, a case where no error is detected (a case of successful decoding with the CRC16) is indicated as CRC16 OK, whereas a case where an error is detected (a case of unsuccessful decoding with the CRC16) is indicated as CRC16 NG. This also holds true for other description as provided hereinbelow.

As illustrated in FIG. 16, in a case where packets are limited to those each effective as the Request-1 packet, a set of CRC16 OK and a set of BCH correction numbers of 2 or less and CRC8 OK do not overlap. Further, there is an overlap between the set of CRC16 OK, and a set of correction numbers of 3 and 4 as wells as CRC8 OK, but the number thereof is limited.

FIG. 17 to FIG. 19 each illustrate a result of calculating all the data of the Request-1 packet decodable by the CRC in both of the normal method and the error correction method by simulation.

As illustrated in FIG. 17, there are 4 patterns of a case where a packet is decodable by the CRC8 with the error correction number 3 (BCH OK (3)+CRC8 OK) (a case of successful decoding by the error correction method), among packets in the normal method that are each effective as the Request-1 packet.

Further, as illustrated in FIG. 18 and FIG. 19, there are 53 patterns of a case where a packet is decodable by the CRC8 with the error correction number 4, among the packets in the normal method that are each effective as the Request-1 packet (BCH OK (4)+CRC8 OK) (a case of successful decoding by the error correction method).

FIG. 20 illustrates an example of a flow of determination processing for the communication method in the communication unit 1B.

In the communication unit 1B, prior to substantial data communication, logical connection called association is established with a communicated unit. As the initial packet of the association, a Request-1 packet is transmitted from the communicated unit.

In the communication unit 1B, at first, the Request-1 packet is decoded with the CRC16 (the normal method) by the error detection decoding section 26 (step S201). Next, in the communication unit 1B, determination is made whether or not CRC16 OK holds true by the error detection decoding section 26 (step S202). In a case where determination is made that CRC16 OK holds true, then, in the communication unit 1B, checking of the Request-1 packet is performed by the Request-1 method determiner 51 or the format control section 52 (step S203) to thereby determine whether or not the Request-1 packet is received in accordance with the standard (whether or not Request-1 OK holds true) (step S204). In the communication unit 1B, in a case where determination is made that Request-1 OK holds true in step S204, reception of data is started by assuming that the method for the transfer data in or after the Request-1 packet is the normal method (step S205). In the communication unit 1B, in a case where determination is made that Request-1 NG holds true in step S204, it is assumed that reception NG holds true (the association not established), and the processing ends (step S213).

In contrast, in the communication unit 1B, in a case where determination is made that CRC16 NG holds true in step S202, BCH decoding is next performed by the error correction decoding section 27 (step S206). Next, determination is made, in the communication unit 1B, whether or not BCH OK holds true by the error correction decoding section 27 (step S207). In a case where determination is made that BCH NG holds true in step S207, it is assumed that reception NG holds true (the association not established) and the processing ends (step S213).

In the communication unit 1B, in a case where determination is made that BCH OK holds true, the Request-1 packet is next decoded with the CRC8 (the error correction method) by the error detection decoding section 28 (step S208). Next, determination is made, in the communication unit 1B, whether or not CRC8 OK holds true by the error detection decoding section 28 (step S209). Next, in the communication unit 1B, in a case where determination is made that CRC8 OK holds true, checking of the Request-1 packet is next performed by the Request-1 method determiner 51 or the format control section 52 (step S210) to thereby determine whether or not the Request-1 packet is received in accordance with the standard (whether or not Request-1 OK holds true) (step S211).

In the communication unit 1B, in a case where determination is made that Request-1 OK holds true in step S211, reception of data is started by assuming that the method for the transfer data in and after the Request-1 packet is the error correction method (step S212). In the communication unit 1B, in a case where determination is made that Request-1 NG holds true in step S211, it is assumed that reception NG holds true (the association not established) and the processing ends (step S213).

As described above, the communication method may be determined by means of the Request-1 packet, and the communication for the Request-1 packet and thereafter may be fixed to the determined communication method.

It is to be noted that, as illustrated in FIG. 16 to FIG. 18 described above, there is a Request-1 packet recognizable as a packet in both of the normal method and the error correction method. However, as for a packet on side of the error correction method, the number of bit errors (the number of corrections) is at least three or more, among packets each recognizable as a correct Request-1 packet in both of the methods.

In the communication unit 1B according to the present embodiment, a method for a packet decodable by both of the methods is recognized in principle as the normal method. In the communication unit 1B, even in a case where a method is recognized as a method opposite to an original method in the first association request and subsequent association continues, a possibility that the subsequent association is established by mistake is extremely low. For this reason, even in the case where the method is recognized as the method opposite to the original method, the association fails as a result, and a retry of the association occurs.

In the communication unit 1B, for example, in a case where an original sending method is the error correction method, when the Request-1 packet is decoded by both of the methods, the method is temporarily recognized as the normal method. However, in a case where subsequent association fails and a retry of the association occurs, a manner of error in the determination of the Request-1 packet at the time of the retry is different from that before the retry, unless an error occurrence point is absolutely identical to that before the retry. For this reason, it is possible to perform recognition as the correct Request-1 packet only by the error correction method at a high probability at the time of the retry.

For the reason described above, in the communication unit 1B, even when there is a packet recognizable by both of the methods, it is possible to determine the correct method as a system, by combination with higher-level control such as retransmission control.

Other configurations, operations, and effects may be substantially similar to those of the communication unit 1 according to the above-described first embodiment.

Further, the communication unit 1B according to the present embodiment as well may further include the detection section 50, substantially similar to the communication unit 1A according to the modification example of the above-described first embodiment.

3. Third Embodiment

Next, a communication system according to a third embodiment of the present disclosure is described. It is to be noted that, in the following, the same components as those of the communication system according to the above-described first or second embodiment are denoted by the same reference numerals, and the descriptions thereof are omitted where appropriate.

FIG. 21 schematically illustrates an example of each of a Request-1 packet in the normal method and a Request-1 packet in the error correction method in the present embodiment.

In the communication unit according to the present embodiment as well, substantially similar to the above-described second embodiment, determination is made as to whether the transfer data are the data in the normal method or the data in the error correction method, on the basis of a result of error detection using the first error detecting code and a result of error detection using the second error detecting code. Further, in the communication unit according to the present embodiment as well, substantially similar to the above-described second embodiment, determination of the communication method is performed in a case where the transfer data are the packet data of the initial (first) association request (Association Request-1).

In the above-described second embodiment, the values of the respective synchronization data in the data in the normal method and in the data in the error correction method are described to be identical. However, in the communication unit according to the present embodiment, the value of the synchronization data varies between these methods, substantially similar to the above-described first embodiment. Specifically, as illustrated in FIG. 21, for example, the value of the last bit of the synchronization data of the Request-1 packet in the error correction method is inverted with respect to the normal method. Other configurations of the Request-1 packet may be substantially similar to those in the above-described second embodiment.

In this way, the determination of the communication method based on a technique substantially similar to that in the communication unit 1B according to the above-described second embodiment may be performed in a state where the last bit of the synchronization data is inverted in both of the methods. In this case, as compared with a case where the determination of the communication method is performed by making the synchronization data in both of the methods identical, the number of combinations in which CRC OK is obtained by both of the methods is decreased, thus making it easier to distinguish between the methods.

FIG. 22 illustrates a universal set of decoding results of a case where the above-described packet configuration is provided and the Request-1 packet in the normal method is decoded as a packet in the error correction method. As illustrated in FIG. 22, in a case where the last bit of the synchronization data is inverted in both of the methods, a set of CRC16 OK and a set of BCH correction numbers of 3 or less and CRC8 OK do not overlap. An overlap between the sets of the respective methods is smaller than that in the case where the synchronization data in both of the methods are identical (FIG. 16). This makes it possible to enhance accuracy in determining the communication method, as compared with the above-described second embodiment.

FIG. 23 and FIG. 24 illustrate a result of calculating all the data of the Request-1 packet decodable by the CRC in both of the normal method and the error correction method by simulation, in a case where the packet configuration in the present embodiment is provided.

As illustrated in FIG. 23 and FIG. 24, in the present embodiment, there are 44 patterns of a case where the CRC8 is decoded with the error correction number 4 (BCH OK (4)+CRC8 OK) (a case of successful decoding by the error correction method), among packets in the normal method that are each effective as the Request-1 packet.

As described above, according to the present embodiment, the determination technique of the above-described first embodiment and the determination technique of the above-described second embodiment are combined as the determination technique for the communication method, thus making it possible to perform the determination of the communication method with higher accuracy. Combing the two determination techniques makes it possible to perform the determination of the communication method with high accuracy even in a case where there is a large amount of noise.

Other configurations, operations, and effects may be substantially similar to those of the communication unit 1 according to the above-described first embodiment or the communication unit 1B according to the above-described second embodiment.

Further, the communication unit 1B according to the present embodiment may also further include the detection section 50, substantially similar to the communication unit 1A according to the modification example of the above-described first embodiment.

4. Fourth Embodiment (Application Example)

The technology according to an embodiment of the present disclosure is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

It is to be noted that, in the following description, GSM and HDMI are each a registered trademark.

FIG. 25 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 25, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay, or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 25 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

FIG. 26 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 25, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), worldwide interoperability for microwave access (WiMAX), long term evolution (LTE), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 25, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 25 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 described above, the communication unit and the communication system of the present disclosure are applicable to, for example, communication with the external environment 7750 such as a terminal present in the vicinity of the vehicle via the general-purpose communication I/F 7620. Further, the communication unit and the communication system are applicable to communication with the in-vehicle device 7760 such as a mobile device or a wearable device possessed by an occupant via the in-vehicle device I/F 7660.

In addition, for example, at least a portion of the components of the digital section 1, etc. described using FIG. 6 may be implemented in a module (e.g., an integrated circuit module configured by one die) for the integrated control unit 7600 illustrated in FIG. 25. Alternatively, at least a portion of the component of the digital section 1, etc. may be implemented by a plurality of control units of the vehicle control system 7000 illustrated in FIG. 25.

5. Other Embodiments

The technology according to the present disclosure is not limited to the descriptions of the foregoing embodiments, and may be modified in a variety of ways.

For example, in the above-described first and third embodiments, the example where the synchronization data are used to determine the communication method is described, but the communication method may be determined by changing, for example, the value of the control header, other than the synchronization data.

Further, data indicating that communication is to be performed by switching to the error correction method may be included in the Payload. In this case, for example, communication is performed in the normal method once, and in a case where the data indicating that communication is to be performed by switching to the error correction method is detected within the Payload, switching to the communication in the error correction method may be performed.

Furthermore, the method for data may be decided beforehand. For example, communication may be performed by assuming that all the transfer data are data in the error correction method.

Moreover, the communication method may be decided using a different communication method such as Bluetooth Low Energy (BLE).

Further, in each of the above-described embodiments, the technique provided to distinguish between the error correction method and the normal method conforming to the CCCC-PHY standard is described, but the technology may also be applied to switching to a communication mode other than the presence or absence of the error correction.

Furthermore, in the above-described first and third embodiments, the example where only a specific point (the last bit of the synchronization data) of the known signal for the determination of the error correction method is changed among the pre-amble and the synchronization data that serve as the known signal is described, but a value other than the specific point of the known signal may be significantly changed. This makes it possible to enhance the accuracy in correlative value detection for the method determination.

Furthermore, in each of the above-described embodiments, the case where the length and the position of the error detecting code in the packet are data that are different between the two methods is described as an example, but the length and the position of the error detecting code in the packet may be each identical between the two methods. In that case, a plurality of error detecting codes that are different in generator polynomial between the two methods may be used, and determination of the communication method may be performed depending on which one of the methods decodes the error detecting codes. Alternatively, the generator polynomials of the error detecting codes may be identical between the two methods, and the initial value may vary between the two methods. Determination of the communication method may be performed depending on which one of the initial values decodes the error detecting code.

For example, the technology may have the following configurations.

(1)

A communication unit including:

a decoding section configured to decode transfer data transmitted from a communicated unit, by a first method using a first error detecting code and a second method using at least an error correcting code; and a determination section that performs determination as to whether the transfer data are data in the first method including the first error detecting code or data in the second method including the error correcting code.

(2)

The communication unit according to (1), further including a selection section that selectively outputs the transfer data decoded by one of the first method and the second method, on the basis of a determination result of the determination section.

(3)

The communication unit according to (1) or (2), in which the data in the first method further includes first synchronization data, the data in the second method further includes second synchronization data different from the first synchronization data, and the determination section performs determination as to whether the transfer data are the data in the first method or the data in the second method, on the basis of a result of detecting which one of the first synchronization data and the second synchronization data is included in the transfer data.

(4)

The communication unit according to (3), in which the second synchronization data are data in which a last bit has a value different with respect to the first synchronization data.

(5)

The communication unit according to (1) or (2), in which the data in the second method further includes a second error detecting code different from the first error detecting code, the decoding section is configured to perform decoding by the second method, using the second error detecting code and the error correcting code, and the determination section performs determination as to whether the transfer data are the data in the first method or the data in the second method, on the basis of a result of error detection using the first error detecting code and the second error detecting code.

(6)

The communication unit according to (5), in which the determination section performs the determination, in a case where the transfer data are packet data of an association request.

(7)

The communication unit according to (5) or (6), in which the determination section determines that the transfer data are the data in the first method, in a case where no error is detected as a result of the error detection using the first error detecting code, and the determination section determines whether or not the transfer data are the data in the second method on the basis of a result of the error detection using the second error detecting, in a case where an error is detected as the result of the error detection using the first error detecting code.

(8)

The communication unit according to any one of (5) to (7), in which the data in the first method further includes first synchronization data, and the data in the second method further includes second synchronization data in which a last bit has a value different with respect to the first synchronization data.

(9)

The communication unit according to any one of (1) to (8), further including a human body electrode and a space electrode that perform communication with the communicated unit through a human body, by means of an electric field method.

(10)

A communication system including:

a first communication unit that transmits transfer data; and a second communication unit that receives the transfer data, the second communication unit including a decoding section configured to decode the transfer data, by a first method using a first error detecting code and a second method using at least an error correcting code, and a determination section that performs determination as to whether the transfer data are data in the first method including the first error detecting code or data in the second method including the error correcting code.

(11) The communication system according to (10), in which the first communication unit includes a first human body electrode and a first space electrode that perform communication with the second communication unit through a human body, by means of an electric field method, and the second communication unit includes a second human body electrode and a second space electrode that perform communication with the first communication unit through the human body, by means of the electric field method.

This application claims the benefit of Japanese Priority Patent Application JP2016-151259 filed with the Japan Patent Office on Aug. 1, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A communication device comprising:
circuitry configured to
decode transfer data transmitted from a second communication device, by a first method using a first error detecting code and a second method using at least an error correcting code; and
determine whether the transfer data is data in the first method including the first error detecting code or in the second method including the error correcting code, wherein
the data in the first method further includes first synchronization data,
the data in the second method further includes second synchronization data different from the first synchronization data, and
the circuitry is configured to determine whether the transfer data is the data in the first method or is the data in the second method on a basis of a result of detecting which one of the first synchronization data and the second synchronization data is included in the transfer data.

2. The communication device according to claim 1, wherein the circuitry is further configured to selectively output the transfer data decoded by one of the first method and the second method, on a basis of a determination that the transfer data is the data in the first method including the first error detecting code or is the data in the second method including the error correcting code.

3. The communication device according to claim 1, wherein the second synchronization data is data in which a last bit has a value different with respect to the first synchronization data.

4. A communication device comprising:
circuitry configured to
decode transfer data transmitted from a second communication device, by a first method using a first error detecting code and a second method using at least an error correcting code; and
determine whether the transfer data is data in the first method including the first error detecting code or in the second method including the error correcting code, wherein
the data in the second method further includes a second error detecting code different from the first error detecting code,
the circuitry is configured to perform decoding by the second method, using the second error detecting code and the error correcting code, and
the circuitry is further configured to determine whether the transfer data is the data in the first method or is the data in the second method on a basis of a result of an error detection using the first error detecting code and the second error detecting code.

5. The communication device according to claim 4, wherein the circuitry is further configured to determine whether the transfer data is the data in the first method including the first error detecting code or is the data in the second method including the error correcting code when the transfer data is packet data of an association request.

6. The communication device according to claim 4, wherein
the circuitry is configured to determine that the transfer data is the data in the first method when no error is detected as a result of the error detection using the first error detecting code, and
the circuitry is configured to determine whether the transfer data is the data in the second method on a basis of a result of the error detection using the second error detecting code when the error is detected as the result of the error detection using the first error detecting code.

7. The communication device according to claim 4, wherein
the data in the first method further includes first synchronization data, and
the data in the second method further includes second synchronization data in which a last bit has a value different with respect to the first synchronization data.

8. The communication device according to claim 1, further comprising:
a human body electrode; and
a space electrode,
wherein the human body electrode and the space electrode are configured to perform communication with the second communication device through a human body, by means of an electric field method.

9. A communication system comprising:
a first communication device that transmits transfer data; and
a second communication device that receives the transfer data,
the second communication device including
circuitry configured to
decode the transfer data, by a first method using a first error detecting code and a second method using at least an error correcting code, and
determine whether the transfer data is data in the first method including the first error detecting code or data in the second method including the error correcting code, wherein
the data in the first method further includes first synchronization data,
the data in the second method further includes second synchronization data different from the first synchronization data, and the circuitry is configured to determine whether the transfer data is the data in the first method or is the data in the second method on a basis of a result of detecting which one of the first synchronization data and the second synchronization data is included in the transfer data.

10. The communication system according to claim 9, wherein
the first communication device includes a first human body electrode and a first space electrode that are configured to perform communication with the second communication device through a human body, by means of an electric field method, and
the second communication device includes a second human body electrode and a second space electrode that are configured to perform communication with the first communication device through the human body, by means of the electric field method.

11. The communication system according to claim 9, wherein the circuitry is further configured to selectively output the transfer data decoded by one of the first method and the second method, on a basis of a determination that the transfer data is the data in the first method including the first error detecting code or is the data in the second method including the error correcting code.

12. The communication system according to claim 9, wherein the second synchronization data is data in which a last bit has a value different with respect to the first synchronization data.

13. A communication system comprising:
a first communication device that transmits transfer data; and
a second communication device that receives the transfer data, the second communication device including circuitry configured to
decode the transfer data, by a first method using a first error detecting code and a second method using at least an error correcting code, and
determine whether the transfer data is data in the first method including the first error detecting code or data in the second method including the error correcting code, wherein
the data in the second method further includes a second error detecting code different from the first error detecting code,
the circuitry is configured to perform decoding by the second method, using the second error detecting code and the error correcting code, and
the circuitry is further configured to determine whether the transfer data is the data in the first method or is the data in the second method on a basis of a result of an error detection using the first error detecting code and the second error detecting code.

14. The communication system according to claim 13, wherein the circuitry is further configured to determine whether the transfer data is the data in the first method including the first error detecting code or is the data in the second method including the error correcting code when the transfer data is packet data of an association request.

15. The communication system according to claim 13, wherein
the circuitry is configured to determine that the transfer data is the data in the first method when no error is detected as a result of the error detection using the first error detecting code, and
the circuitry is configured to determine whether the transfer data is the data in the second method on a basis of a result of the error detection using the second error detecting code when the error is detected as the result of the error detection using the first error detecting code.

16. The communication system according to claim 13, wherein
the data in the first method further includes first synchronization data, and
the data in the second method further includes second synchronization data in which a last bit has a value different with respect to the first synchronization data.

17. The communication device according to claim 4, further comprising:
a human body electrode; and
a space electrode,
wherein the human body electrode and the space electrode are configured to perform communication with the second communication device through a human body, by means of an electric field method.

18. The communication system according to claim 13, wherein
the first communication device includes a first human body electrode and a first space electrode that are configured to perform communication with the second communication device through a human body, by means of an electric field method, and
the second communication device includes a second human body electrode and a second space electrode that are configured to perform communication with the first communication device through the human body, by means of the electric field method.

* * * * *